US011616926B2

(12) United States Patent
Jun et al.

(10) Patent No.: US 11,616,926 B2
(45) Date of Patent: Mar. 28, 2023

(54) ANALOG-TO-DIGITAL CONVERTING CIRCUIT USING OUTPUT SIGNAL FEEDBACK AND OPERATION METHOD THEREOF

(71) Applicant: SAMSUNG ELECTRONICS CO., LTD., Suwon-si (KR)

(72) Inventors: Jaehoon Jun, Suwon-si (KR); Han Yang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/569,844

(22) Filed: Jan. 6, 2022

(65) Prior Publication Data

US 2022/0353452 A1    Nov. 3, 2022

(30) Foreign Application Priority Data

Apr. 29, 2021 (KR) .................. 10-2021-0055906
Jun. 11, 2021 (KR) .................. 10-2021-0076087

(51) Int. Cl.

| H04N 5/374 | (2011.01) |
| H04N 5/369 | (2011.01) |
| H04N 5/378 | (2011.01) |
| H03M 1/56 | (2006.01) |
| H03M 1/14 | (2006.01) |
| H03M 1/12 | (2006.01) |
| H04N 5/3745 | (2011.01) |

(52) U.S. Cl.
CPC .......... H04N 5/37455 (2013.01); H03M 1/56 (2013.01); H04N 5/3698 (2013.01); H04N 5/37457 (2013.01)

(58) Field of Classification Search
CPC ........... H04N 5/37455; H04N 5/37457; H04N 5/3698; H04N 5/378; H03M 1/56; H03N 1/14; H03N 1/1295
See application file for complete search history.

(56) References Cited

U.S. PATENT DOCUMENTS

| 7,227,488 B2 | 6/2007 | Cho |
| 7,304,599 B2 | 12/2007 | Lee |
| 8,035,066 B2 | 10/2011 | Abe et al. |
| 8,395,539 B2 * | 3/2013 | Lim ..................... H03M 1/56 |
| | | 341/169 |
| 10,021,329 B2 | 7/2018 | Ohmaru |
| 10,230,915 B2 | 3/2019 | Maehashi |
| 10,616,518 B2 * | 4/2020 | Jung ................... H04N 5/3745 |
| 10,694,131 B2 | 6/2020 | Jung et al. |

(Continued)

*Primary Examiner* — Marly S Camargo
(74) *Attorney, Agent, or Firm* — Sughrue Mion, PLLC

(57) ABSTRACT

Disclosed is a circuit which includes a first amplifier that generates a first output signal by comparing a ramp signal and a reset signal of a pixel signal output from a pixel array in a first operating period and comparing the ramp signal and an image signal of the pixel signal output from the pixel array in a second operating period, a second amplifier that generates a second output signal based on the first output signal, and a counter. During at least one operating period of the first operating period and the second operating period, the first output signal controls a first source current of the first amplifier, or the second output signal controls at least one of the first source current of the first amplifier and a second source current of the second amplifier.

20 Claims, 18 Drawing Sheets

(56) References Cited

U.S. PATENT DOCUMENTS

| | | | |
|---|---|---|---|
| 11,477,408 B2* | 10/2022 | Song | H04N 5/378 |
| 2019/0116331 A1* | 4/2019 | Jung | H04N 5/37455 |
| 2021/0074205 A1* | 3/2021 | Lee | H02M 3/1582 |
| 2021/0368090 A1* | 11/2021 | Funaki | H01L 27/1463 |
| 2022/0116564 A1* | 4/2022 | Paik | H04N 5/3745 |

* cited by examiner

ANALOG-TO-DIGITAL CONVERTING CIRCUIT USING OUTPUT SIGNAL FEEDBACK AND OPERATION METHOD THEREOF

CROSS-REFERENCE TO RELATED APPLICATIONS

This application claims priority from Korean Patent Application Nos. 10-2021-0055906 filed on Apr. 29, 2021 and 10-2021-0076087 filed on Jun. 11, 2021, in the Korean Intellectual Property Office, the disclosures of which are incorporated by reference herein in their entireties.

BACKGROUND

Embodiments described herein relate to an analog-to-digital converter, and more particularly, relate to an analog-to-digital converting circuit using a feedback of an output signal and an operation method thereof.

An image sensor includes a charge coupled device (CCD) image sensor, a complementary metal-oxide semiconductor (CMOS) image sensor (CIS), etc. The CMOS image sensor includes pixels implemented with CMOS transistors and converts light energy into an electrical signal by using a photoelectric conversion element included in each pixel. The CMOS image sensor obtains information about a captured/photographed image by using the electrical signal generated by each pixel.

An analog-to-digital converter (ADC) receives an analog input voltage and converts the received analog input voltage to a digital signal. The converted digital signal may be sent to other devices. The ADC may be used in various signal processing devices. As the performance of a signal processing device is improved, nowadays, an improved resolution of an analog signal is required. As such, there is used an ADC capable of processing many signals within a unit time or providing an improved resolution of each signal. However, the above-described ADC causes an increase of power consumption.

SUMMARY

Embodiments of the present disclosure provide an analog-to-digital converting circuit having reduced power consumption by using a feedback of an output signal, an operation method thereof, and an electronic device including the same.

According to an embodiment, there is provided a circuit that may include: a first amplifier that generates a first output signal by comparing a ramp signal and a reset signal of a pixel signal output from a pixel array in a first operating period and comparing the ramp signal and an image signal of the pixel signal output from the pixel array in a second operating period; a second amplifier that generates a second output signal based on the first output signal; and a counter that counts pulses of the second output signal, and output a counting result as a digital signal. During at least one operating period of the first operating period and the second operating period, the first output signal controls a first source current of the first amplifier, or the second output signal controls at least one of the first source current of the first amplifier and a second source current of the second amplifier.

According to an embodiment, there is provided an image sensor that may include: a pixel array that converts a light into an electrical signal to generate a pixel signal; a ramp signal generator that generates a ramp signal; and an analog-to-digital converting circuit that converts the pixel signal into a digital signal. The analog-to-digital converting circuit may include: a first amplifier that generates a first output signal by comparing a reset signal of the pixel signal and the ramp signal in a first operating period and comparing an image signal of the pixel signal and the ramp signal in a second operating period; a second amplifier configured to generate a second output signal based on the first output signal; and a counter that counts pulses of the second output signal, and output a counting result as a digital signal. During at least one operating period of the first operating period and the second operating period, the first output signal controls a first source current of the first amplifier, or the second output signal controls at least one of the first source current of the first amplifier and a second source current of the second amplifier.

According to an embodiment, there is provided a circuit that may include: a first amplifier that generates a first output signal by comparing a ramp signal and a reset signal of a pixel signal output from a pixel array in a first operating period and comparing the ramp signal and an image signal of the pixel signal output from the pixel array in a second operating period; a second amplifier that generates a second output signal based on the first output signal; and a counter that counts pulses of the second output signal, and output a counting result as a digital signal. During the first operating period and the second operating period, the second amplifier controls a source current of the second amplifier using the second output signal According to an embodiment, there is provide an operation method of an analog-to-digital converting circuit that may include: comparing a pixel signal output from a pixel array with a ramp signal to generate a first output signal; generating a second output signal based on the first output signal; and controlling a source current of the analog-to-digital converting circuit by using the first output signal or the second output signal.

BRIEF DESCRIPTION OF THE FIGURES

The above and other objects and features will become apparent by describing in detail embodiments thereof with reference to the accompanying drawings.

DETAILED DESCRIPTION

Below, embodiments will be described in detail and clearly to such an extent that one skilled in the art easily carries out the present disclosure.

All of the embodiments described herein are example embodiments, and thus, the embodiments are not limited thereto and may be realized in various other forms. Each of the embodiments provided in the following description is not excluded from being associated with one or more features of another example or another embodiment also provided herein or not provided herein but consistent with the inventive concept.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

In the detailed description, components described with reference to the terms "unit", "module", "block", "~er or ~or", etc. and function blocks illustrated in drawings will be implemented with software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

Figure 1:
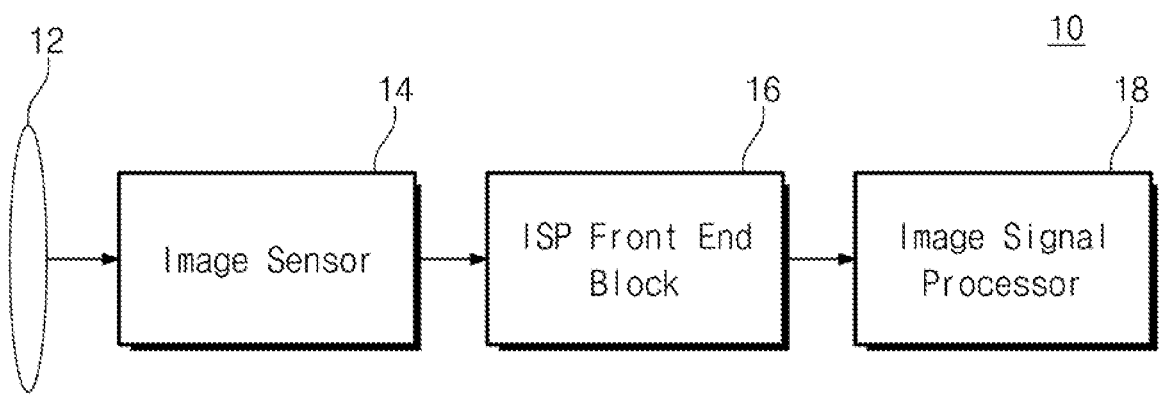
FIG. 1 illustrates an example of a configuration of an image processing block according to an embodiment.

FIG. 1 illustrates an example of a configuration of an image processing block 10, according to an embodiment. The image processing block 10 may be implemented as a part of various electronic devices such as a smartphone, a digital camera, a laptop computer, and a desktop computer. The image processing block 10 may include a lens 12, an image sensor 14, an image signal processor (ISP) front end block 16, and an image signal processor 18.

A light may be reflected by an object, a scenery, etc. targeted for photographing, and the lens 12 may receive the reflected light. The image sensor 14 may generate an electrical signal based on the light received through the lens 12. For example, the image sensor 14 may be implemented with a complementary metal-oxide semiconductor (CMOS) image sensor or the like. For example, the image sensor 14 may be a multi-pixel image sensor having a dual pixel structure or a tetracell structure.

The image sensor 14 may include a pixel array. Pixels of the pixel array may convert a light into electrical signals to generate pixel values. In addition, the image sensor 14 may include an analog-to-digital converting (ADC) circuit for performing correlated double sampling (CDS) on the pixel values. A configuration of the image sensor 14 will be described in more detail with reference to FIG. 2.

The ISP front end block 16 may perform pre-processing on an electrical signal output from the image sensor 14 so that the electric signal may be appropriate for processing by the image signal processor 18.

The image signal processor 18 may generate image data associated with the photographed object and scenery by appropriately processing the electrical signal processed by the ISP front end block 16. To this end, the image signal processor 18 may perform various processing such as color correction, auto white balance, gamma correction, color saturation correction, formatting, bad pixel correction, and hue correction.

One lens 12 and one image sensor 14 are illustrated in FIG. 1. However, in another embodiment, the image processing block 10 may include a plurality of lenses, a plurality of image sensors, and a plurality of ISP front end blocks. In this case, the plurality of lenses may have different fields of view. Also, the plurality of image sensors may have different functions, different performances, and/or different characteristics, and may respectively include pixel arrays of different configurations.

Figure 2:
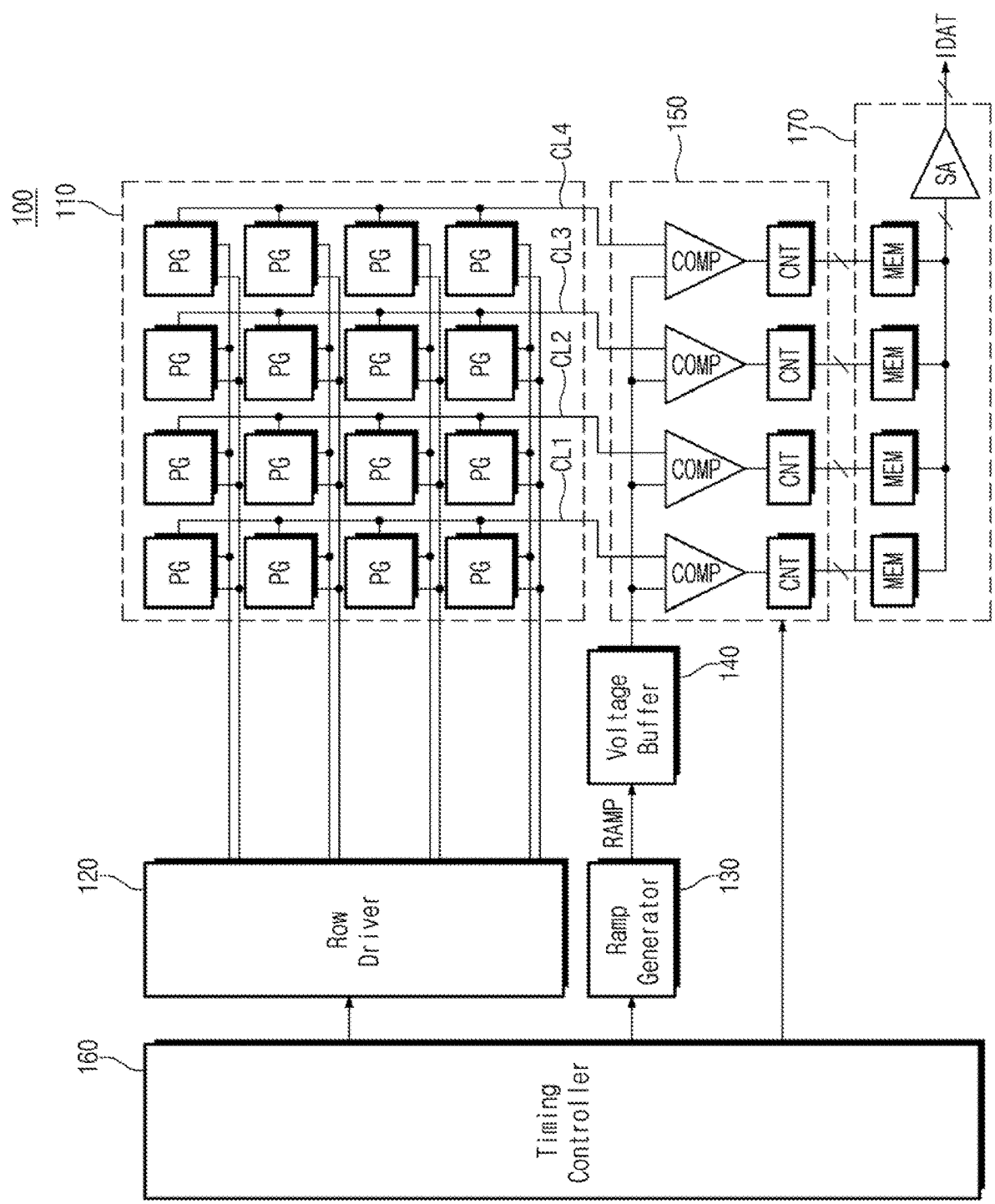
FIG. 2 illustrates an example of a configuration of an image sensor of FIG. 1.

FIG. 2 illustrates an example of a configuration of the image sensor 14 of FIG. 1. An image sensor 100 may include a pixel array 110, a row driver 120, a ramp signal generator 130, a voltage buffer 140, an ADC circuit 150, a timing controller 160, and a buffer 170.

The pixel array 110 may include a plurality of pixels arranged along rows and columns in the form of a matrix. Each of the plurality of pixels may include a photoelectric conversion element. For example, the photoelectric conversion element may include a photo diode, a photo transistor, a photo gate, a pinned photo diode, etc.

The pixel array 110 may include a plurality of pixel groups PG. Each pixel group PG may include two or more pixels, that is, a plurality of pixels. A plurality of pixels constituting a pixel group PG may share one floating diffusion region or a plurality of floating diffusion regions. An example in which the pixel array 110 includes pixel groups PG arranged in four rows and four columns (i.e., 4×4 pixel groups PG) is illustrated in FIG. 2. However, the present disclosure is not limited thereto.

The pixel group PG may include pixels of the same color. For example, the pixel group PG may include red pixels to convert a light of a red spectrum into an electrical signal, green pixels to convert a light of a green spectrum into an electrical signal, or blue pixels to convert a light of a blue spectrum into an electrical signal. For example, the pixels constituting the pixel array 110 may be arranged in the form of a tetra-Bayer pattern.

The pixels of the pixel array 110 may output pixel signals through column lines CL1 to CL4, depending on the intensity or the amount of light received from the outside. For example, the pixel signals may be analog signals, each of which corresponds to the intensity or the amount of light received from the outside. The pixel signals may pass through voltage buffers (e.g., source followers) and may then be provided to the ADC circuit 150 through the column lines CL1 to CL4.

The row driver 120 may select and drive a row of the pixel array 110. The row driver 120 may decode an address and/or a control signal generated by the timing controller 160, and may generate control signals for selecting and driving a row of the pixel array 110. For example, the control signals may include a signal for selecting a pixel, a signal for resetting a floating diffusion region, etc.

The ramp signal generator 130 may generate a ramp signal RAMP under control of the timing controller 160. For example, the ramp signal generator 130 may operate in response to a control signal such as a ramp enable signal. When the ramp enable signal is activated, the ramp signal generator 130 may generate the ramp signal RAMP depending on preset values (e.g., a start level, an end level, and a slope). In other words, the ramp signal RAMP may be a signal that increases or decreases along a preset slope during a specific time. The ramp signal RAMP may be provided to the ADC circuit 150 through the voltage buffer 140.

The ADC circuit 150 may receive pixel signals from a plurality of pixels of the pixel array 110 through the column lines CL1 to CL4, and may receive the ramp signal RAMP from the ramp signal generator 130 through the voltage buffer 140. The ADC circuit 150 may operate based on a correlated double sampling (CDS) technique for obtaining a reset signal and an image signal from a received pixel signal and extracting a difference between the reset signal and the image signal as an effective signal component. The ADC circuit 150 may include a plurality of comparators COMP and a plurality of counters CNT.

In detail, each of the comparators COMP may compare the reset signal of the pixel signal with the ramp signal RAMP, compare the image signal of the pixel signal with the ramp signal RAMP, and perform correlated double sampling (CDS) on comparison results. Each of the counters CNT may count pulses of a signal on which the correlated double sampling is performed, and output a counting result as a digital signal. Also, the ADC circuit 150 may be implemented to reduce power consumption by using an output feedback. An example in which the ADC circuit 150 includes four comparators COMP and four counters CNT is illustrated in FIG. 2, but the present disclosure is not limited thereto.

The timing controller 160 may generate a control signal and/or a clock for controlling an operation and/or a timing of each of the row driver 120, the ramp signal generator 130, and the ADC circuit 150.

The buffer 170 may include memories MEMS and a sense amplifier SA. The memories MEM may store digital signals output from the corresponding counters CNT of the ADC circuit 150. The sense amplifier SA may sense and amplify the digital signals stored in the memories MEMS. The sense amplifier SA may output the amplified digital signal as image data DAT, and the image data DAT may be provided to the ISP front end block 16 of FIG. 1.

Figure 3:
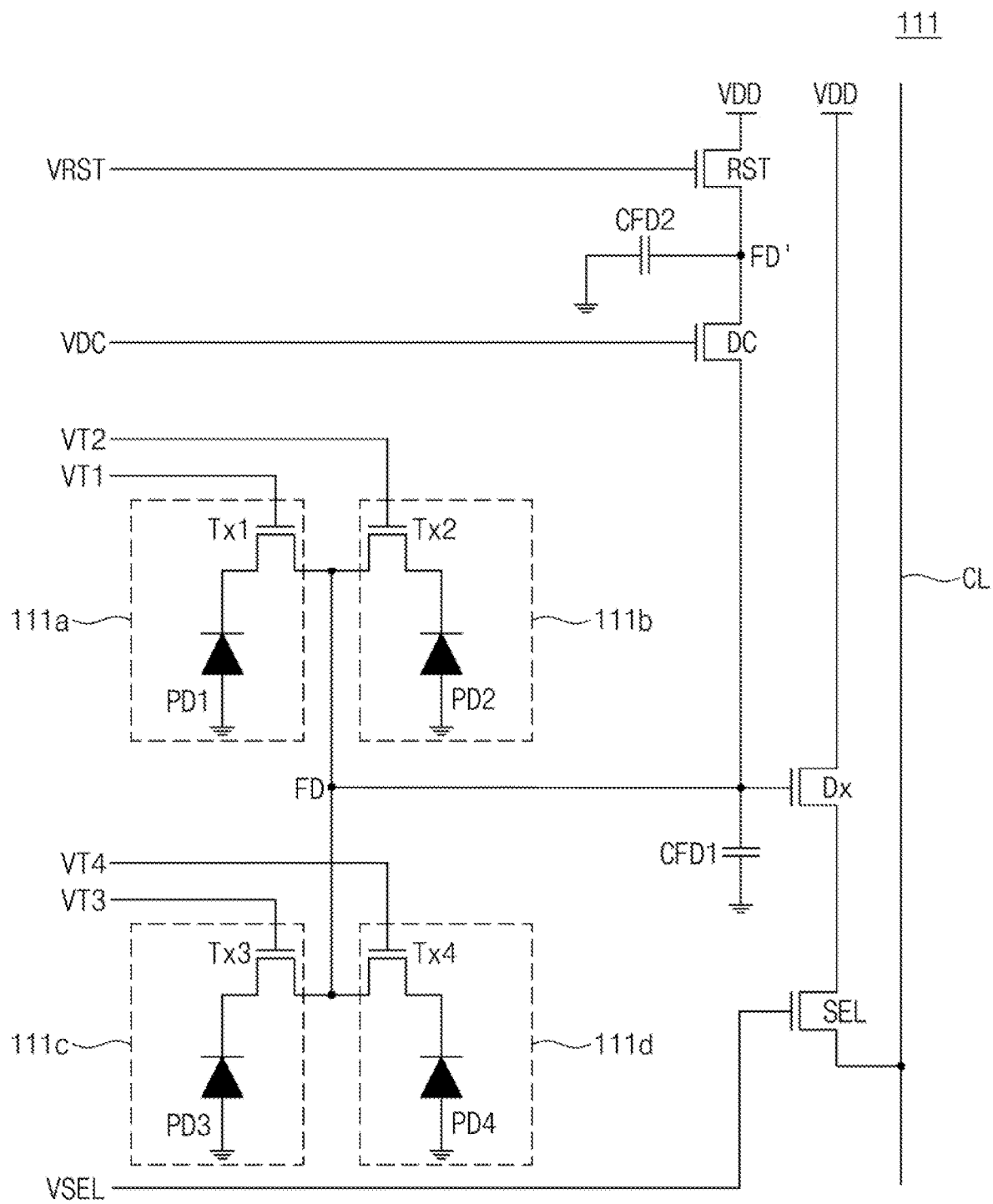
FIG. 3 is a circuit diagram illustrating an example of one among pixel groups of a pixel array of FIG. 2.

FIG. 3 is a circuit diagram illustrating an example of one among the pixel groups PG of the pixel array 110 of FIG. 2. For example, a pixel group 111 may include pixels 111a to 111d, photoelectric conversion elements PD1 to PD4, transfer transistors Tx1 to Tx4, a reset transistor RST, a dual conversion transistor DC, a drive transistor Dx, and a select transistor SEL. An example of the pixel group 111 having a tetracell structure in which four pixels 111a to 111d include photoelectric conversion elements PD1 to PD4 respectively is illustrated in FIG. 3, but the present disclosure is not limited thereto. For example, the pixel group 111 may be implemented to have various different structures.

The first pixel 111a may include the first photoelectric conversion element PD1 and the first transfer transistor Tx1, and each of the remaining pixels 111b, 111c, and 111d may also include similar components/elements. The pixels 111a to 111d may share the reset transistor RST, the dual conversion transistor DC, the drive transistor Dx, and the select transistor SEL. Also, the pixels 111a to 111d may share a floating diffusion region FD.

The dual conversion transistor DC may be driven by a dual conversion signal VDC. When the dual conversion transistor DC is turned off, the floating diffusion region FD may be connected with a first floating diffusion capacitor CFD1, and a capacitance of the floating diffusion region FD may correspond to a capacitance of the first floating diffusion capacitor CFD1.

When the dual conversion transistor DC is turned on, the floating diffusion region FD may be connected with both the first floating diffusion capacitor CFD1 and a second floating diffusion capacitor CFD2. An extended floating diffusion region FD' indicates a floating diffusion region when the dual conversion transistor DC is turned on. The second floating diffusion capacitor CFD2 may be provided to prevent saturation. For example, the floating diffusion capacitors CFD1 and CFD2 may be a parasitic capacitor and/or a capacitor element.

The transfer transistors Tx1 to Tx4 may be respectively driven by transfer signals VT1 to VT4, and may transfer charges generated (or integrated) by the photoelectric conversion elements PD1 to PD4 to the floating diffusion region FD or the extended floating diffusion region FD'. For example, first ends of the transfer transistors Tx1 to Tx4 may be respectively connected with the photoelectric conversion elements PD1 to PD4, and second ends thereof may be connected in common with the first floating diffusion region FD.

The floating diffusion region FD or the extended floating diffusion region FD' may integrate charges corresponding to the amount of incident light. While the transfer transistors Tx1 to Tx4 are respectively turned on by the transfer signals VT1 to VT4, the floating diffusion region FD or the extended floating diffusion region FD' may integrate charges supplied from the photoelectric conversion elements PD1 to PD4. Because the floating diffusion region FD is connected with a gate terminal of the drive transistor Dx operating as a source follower amplifier, a voltage corresponding to the charges integrated at the floating diffusion region FD may be formed.

The reset transistor RST may be driven by a reset signal VRST, and provide a power supply voltage VDD to the floating diffusion region FD or the extended floating diffusion region FD'. As such, the charges integrated at the floating diffusion region FD or the extended floating diffusion region FD' may move to a terminal for the power supply voltage VDD, and a voltage of the floating diffusion region FD or the extended floating diffusion region FD' may be reset.

The drive transistor Dx may amplify a voltage of the floating diffusion region FD or the extended floating diffusion region FD', and generate a pixel signal PIX corresponding to a result of the amplification. The select transistor SEL may be driven by a selection signal VSEL, and select pixels to be read in units of row. When the select transistor SEL is turned on, the pixel signal PIX may be output to the ADC circuit 150 of FIG. 2 through a column line CL.

Figure 4:
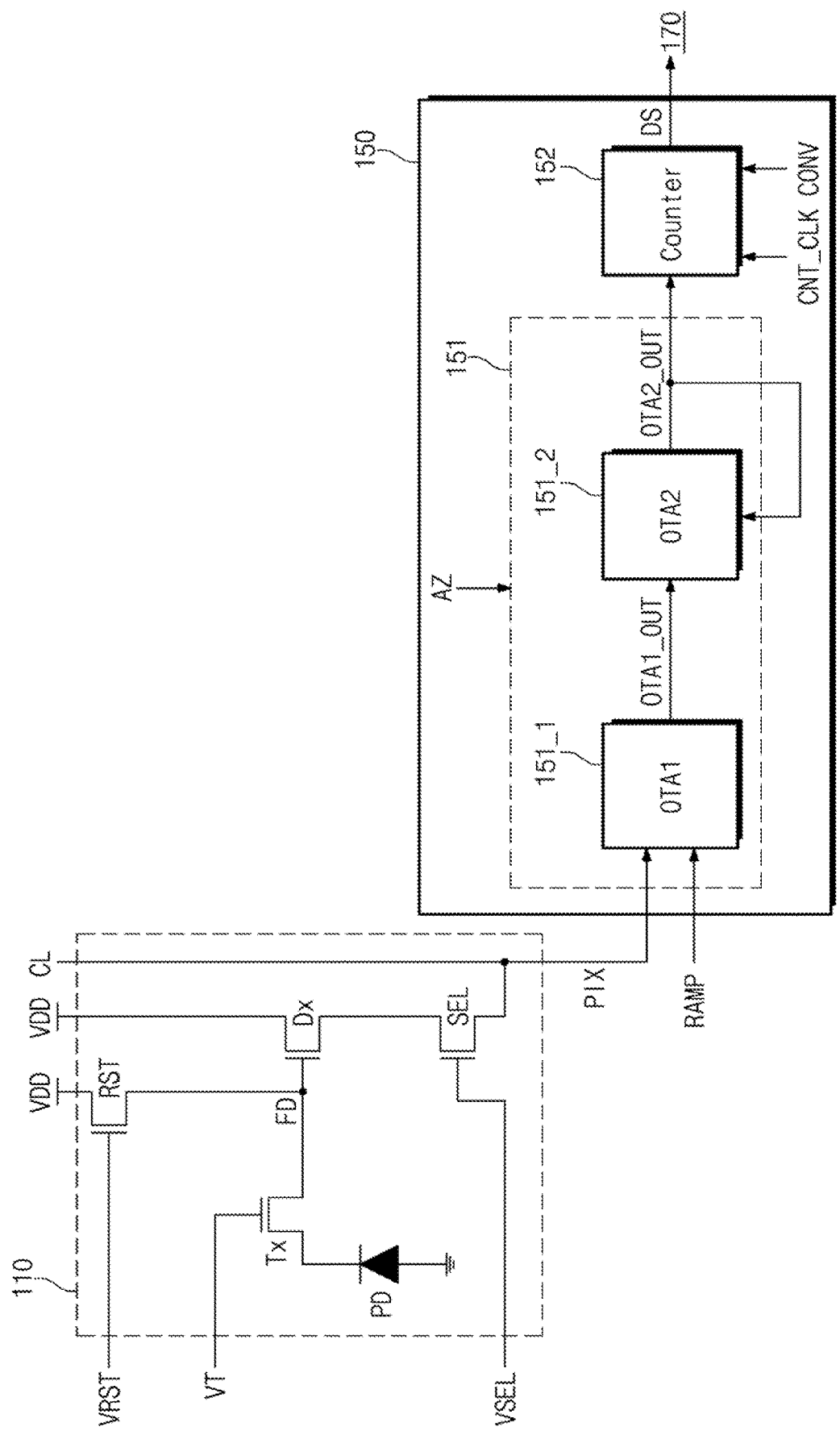
FIG. 4 illustrates an example of a configuration of an analog-to-digital converting circuit of FIG. 2.

FIG. 4 illustrates an example of a configuration of the analog-to-digital converting (ADC) circuit 150 of FIG. 2. The ADC circuit 150 may include a comparator 151 and a counter 152. The ADC circuit 150 may convert and output the pixel signal PIX, which is an analog signal output from the pixel array 110, into a digital signal DS. For the clearness of description and the brevity of drawing, an example in which the pixel array 110 includes only one pixel is illustrated in FIG. 4, and the configuration and function of the pixel array 110 are identical to those described with reference to FIG. 3.

In detail, as described with reference to FIG. 2, the comparator 151 may compare a reset signal of a pixel signal with the ramp signal RAMP, compare an image signal of the pixel signal with the ramp signal RAMP, and perform correlated double sampling (CDS) on comparison results, and the counter 152 may count pulses of a signal on which the correlated double sampling (CDS) is performed, and output a counting result as a digital signal. FIG. 4 will be described with reference to FIGS. 2 and 3.

For example, the comparator 151 may have a two-stage structure including two amplifiers (i.e., a first amplifier 151_1 and a second amplifier 151_2), and each of the first amplifier 151_1 and the second amplifier 151_2 may be implemented as an operational transconductance amplifier (OTA). However, the present disclosure is not limited thereto. For example, the comparator 151 may have a structure including a more number of amplifiers. Also, the ADC circuit 150 may include a plurality of comparators and a plurality of counters, but one comparator 151 and one counter 152 are illustrated in FIG. 4 for the clearness of description.

The first amplifier 151_1 may receive the pixel signal PIX from the pixel array 110 through the column line CL, and receive the ramp signal RAMP from the ramp signal generator 130 through the voltage buffer 140. The first amplifier 151_1 may output a first output signal OTA1_OUT based on the received signals. For example, in a period where a level of the ramp signal RAMP is higher than a level of the pixel signal PIX, the first amplifier 151_1 may output a first output signal OTA1_OUT having a high level, and in a period where the level of the ramp signal RAMP is lower than the level of the pixel signal PIX, the first amplifier 151_1 may output the first output signal OTA1_OUT having a low level. The comparison operation of the first amplifier 151_1 described above may be performed both when a reset signal of the pixel signal PIX and the ramp signal RAMP are compared and when an image signal of the pixel signal PIX and the ramp signal RAMP are compared.

The second amplifier 151_2 may amplify the first output signal OTA1_OUT to output a second output signal OTA2_OUT, which is a comparison signal. For example, the second output signal OTA2_OUT may be an inverted version of the first output signal OTA1_OUT. In other words, the second amplifier 151_2 may output the second output signal OTA2_OUT having the low level during the high level of the first output signal OTA1_OUT, and output the second output signal OTA2_OUT having the high level during the low level of the first output signal OTA1_OUT.

In addition, the second output signal OTA2_OUT may be fed back to the second amplifier 151_2. The second output signal OTA2_OUT fed back to the second amplifier 151_2 may control a power source (e.g., a current source) of the second amplifier 151_2, and reduce power consumption of the ADC circuit 150.

The output feedback operation of the second amplifier 151_2 described above may be performed both when the reset signal of the pixel signal PIX and the ramp signal RAMP are compared and when the image signal of the pixel signal PIX and the ramp signal RAMP are compared.

In the following description, that a voltage level of the first output signal OTA1_OUT or the second output signal OTA2_OUT transitions from the high level to the low level or from the low level to the high level as the comparator 151 performs the comparison operation may be referred to as "decision of the ADC circuit 150".

In other words, "after the decision of the circuit 150 ends" may mean "after a voltage level of the first output signal OTA1_OUT or the second output signal OTA2_OUT changes from the high level to the low level or from the low level to the high level". In an auto-zero period before the comparison operation is performed, the comparator 151 may be initialized in response to an auto-zero signal AZ, and then again perform the comparison operation.

The counter 152 may operate under control of the timing controller 160, may count pulses of the second output signal OTA2_OUT, and output a counting result as the digital signal DS. For example, the counter 152 may operate in response to control signals such as a counter clock signal CNT_CLK and an inversion signal CONV for inverting an internal bit of the counter 152.

For example, the counter 152 may include an up/down counter, a bit-wise inversion counter, etc. An operation of the bit-wise counter may be similar to an operation of the up/down counter. For example, the bit-wise counter may perform a function of performing only up-counting, and a function of converting all internal bits of the counter 152 to obtain the 1's complement when a specific signal is input thereto. The bit-wise counter may perform a reset count, and then invert a result of the reset count so that the result of the reset count is converted into the 1's complement, that is, a negative value.

Figure 5:
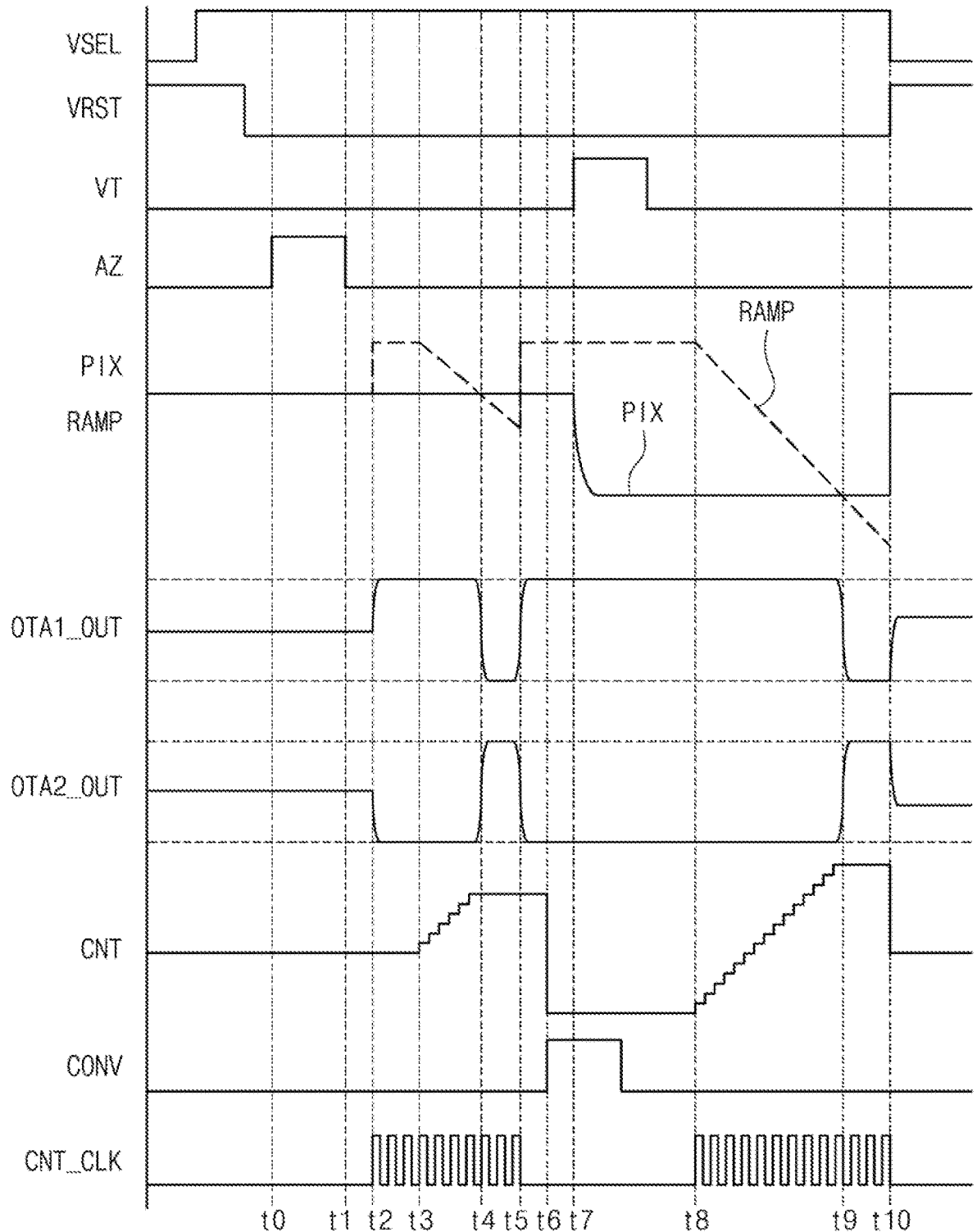
FIG. 5 is an example of a timing diagram indicating an operation of an analog-to-digital converting circuit of FIG. 4.

FIG. 5 is an example of a timing diagram indicating an operation of the analog-to-digital converting (ADC) circuit 150 of FIG. 4. Referring to FIG. 5, a period from time t0 to time t1 may be defined as an auto-zero period, and a period from time t1 to time t10 may be defined as a comparison operation period. The selection signal VSEL may be activated before time t0, and the pixel signals PIX may be output from t plurality of pixel groups (e.g., pixel groups illustrated in FIG. 3) of the pixel array of FIG. 2. Also, a power supply voltage may be provided by the reset signal VRST activated before time t0. Below, FIG. 5 will be described with reference to FIG. 4.

The auto-zero signal AZ may be activated from time t0 to time t1, and the comparator 151 may be initialized in response to the auto-zero signal AZ. For example, input nodes and/or output nodes of the first amplifier 151_1 and the second amplifier 151_2 may be set to the same voltage level. To perform digital conversion on a reset signal of the pixel signal PIX, an offset may be applied to the ramp signal RAMP at time t2, and the ramp signal RAMP may decrease from time t3. The counter 152 may count a counting clock signal CNT_CLK from time t3 to time t4 at which a polarity of the second output signal OTA2_OUT, which is an output of the second amplifier 151_2, changes.

In the case where the digital conversion for the reset signal ends, to convert an image signal of the pixel signal PIX into a digital signal at time t5, an offset may again be applied to the ramp signal RAMP at time t5, and bits of the counter 152 may be inverted in response to the inversion signal CONV at time t6. A transfer signal VT may be activated at time t7, and during the activation of the transfer signal VT, a voltage level of an input node of the first amplifier 151_1, through which the pixel signal PIX corresponding to charges integrated by the photoelectric conversion element PD is received, may change.

To perform digital conversion on the image signal, a level of the ramp signal RAMP may decrease at time t8. The counter 152 may count the counting clock signal CNT_CLK from time t8 to time t9 at which a polarity of the second output signal OTA2_OUT, which is an output of the second amplifier 151_2, changes. In the case where the digital conversion for the image signal ends, the ADC circuit 150 may be initialized for a next comparison operation (i.e., for correlated double sampling).

The operation timing of the ADC circuit 150 is described with reference to FIG. 5, but the present disclosure is not limited thereto. For example, timings of signals may be changed or modified depending on the way to implement the ADC circuit 150 (e.g., structures of the first amplifier 151_1 and the second amplifier 151_2).

Figure 6:
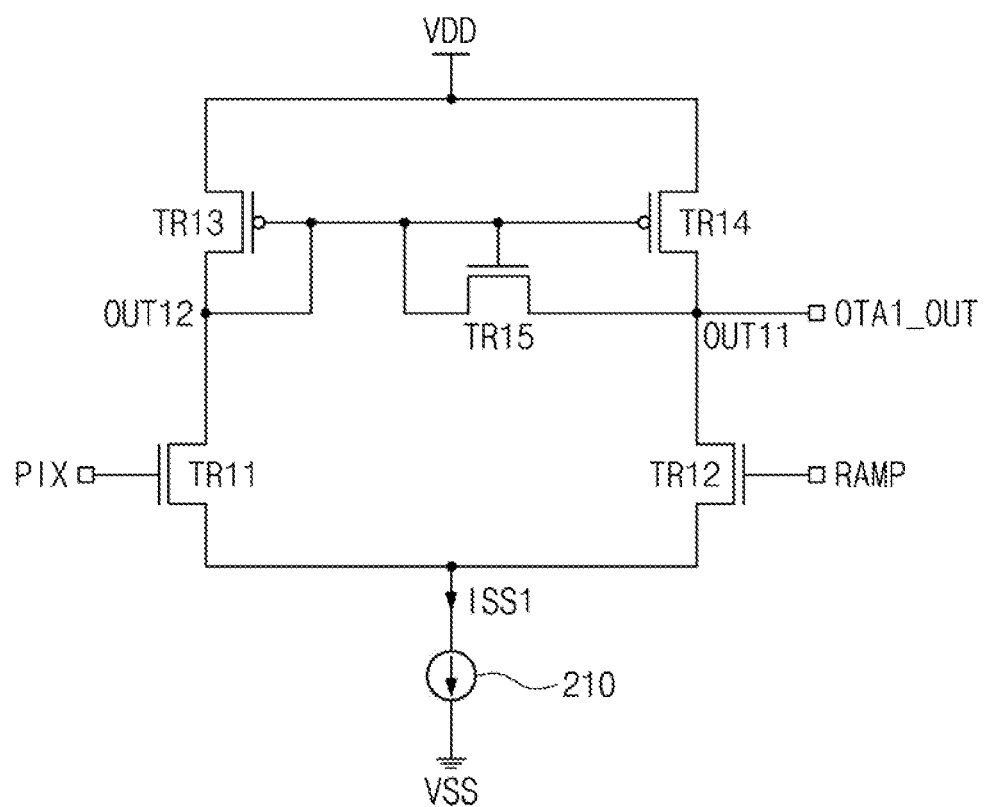
FIG. 6 is a circuit diagram illustrating an example of a first amplifier of FIG. 4.

FIG. 6 is a circuit diagram illustrating an example of the first amplifier 151_1 of FIG. 4. A first amplifier 200 may include a plurality of transistors TR11 to TR15 and a first current source 210. For example, the first transistor TR11, the second transistor TR12, and the fifth transistor TR15 may be NMOS transistors, and the third transistor TR13 and the fourth transistor TR14 may be PMOS transistors. However, the present disclosure is not limited thereto. The first to fifth transistors TR11 to TR15 may be implemented with transistors, whose types are different from those illustrated in FIG. 6.

Referring to FIG. 6, the pixel signal PIX may be input to a gate terminal of the first transistor TR11, and the ramp signal RAMP may be input to a gate terminal of the second transistor TR12. Source terminals of the first and second transistors TR11 and TR12 may be connected in common with the first current source 210. The third and fourth transistors TR13 and TR14 may be connected in the form of a current mirror. A sum of currents flowing to the first and second transistors TR11 and TR12 may be equal to a first source current ISS1.

A gate terminal and a drain terminal of the third transistor TR13 and a drain terminal of the first transistor TR11 may be connected in common with a second output node OUT12, and a drain terminal of the fourth transistor TR14 and a drain terminal of the second transistor TR12 may be connected in common with a first output node OUT11. The fifth transistor TR15 may be connected between the first and second output nodes OUT11 and OUT12. For example, the fifth transistor TR15 may control a voltage level of a signal that is output from the first output node OUT11.

The first output signal OTA1_OUT may be output from the first output node OUT11. For example, in a period where a level of the ramp signal RAMP is higher than a level of the pixel signal PIX, the first output signal OTA1_OUT may have the high level, and in a period where the level of the ramp signal RAMP is lower than the level of the pixel signal PIX, the first output signal OTA1_OUT may have the low level. The first output signal OTA1_OUT may be provided to the second amplifier 151_2 of FIG. 4.

Figure 7:
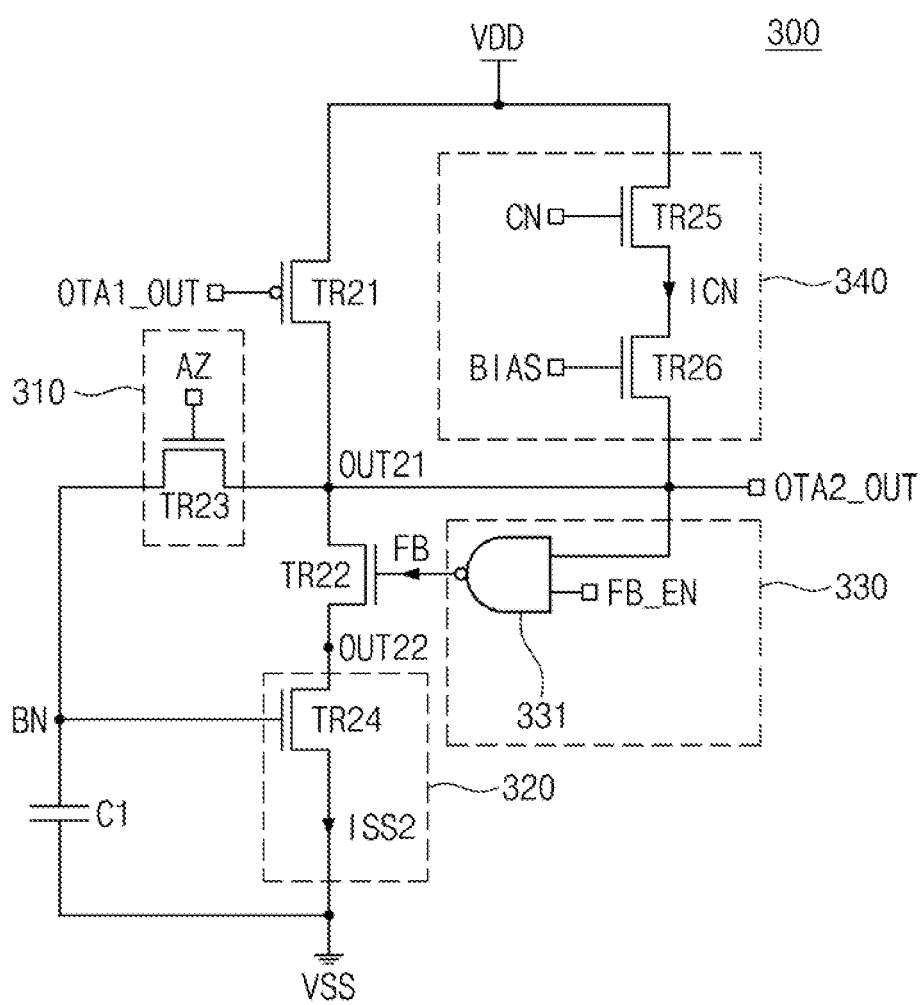
FIG. 7 is a circuit diagram illustrating an example of a second amplifier of FIG. 4.

FIG. 7 is a circuit diagram illustrating an example of the second amplifier 151_2 of FIG. 4. A second amplifier 300 may include a plurality of transistors TR21 to TR26, a capacitor C1, a switching circuit 310, a second current source 320, a feedback circuit 330, and a control circuit 340. For example, the sixth transistor TR21 may be a PMOS transistor, and the seventh to eleventh transistors TR22 to TR26 may be NMOS transistors. However, the present disclosure is not limited thereto. The sixth to eleventh transistors TR21 to TR26 may be implemented with transistors, whose types are different from those illustrated in FIG. 6.

The sixth transistor TR21 may receive the first output signal OTA1_OUT from the first amplifier 151_1 of FIG. 4 as an input, and operate in response to the first output signal OTA1_OUT. For example, when a voltage level of the first output signal OTA1_OUT is the high level, the sixth transistor TR21 may be turned off. In this case, because a current does not flow to a third output node OUT21, a voltage level of the second output signal OTA2_OUT may be the low level. In contrast, when the voltage level of the first output signal OTA1_OUT is the low level, the sixth transistor TR21 may be turned on. In this case, because a current flows to the third output node OUT21, the voltage level of the second output signal OTA2_OUT may be the high level.

In other words, the second amplifier 300 may operate as an inversion amplifier. That is, when the voltage level of the first output signal OTA1_OUT increases, the voltage level of the second output signal OTA2_OUT may decrease. Also, when the sixth transistor TR21 is turned on, a current may also flow to the seventh transistor TR22. The second output signal OTA2_OUT may be provided to the feedback circuit 330.

The seventh transistor TR22 may be connected between the third output node OUT21 and a fourth output node OUT22. The seventh transistor TR22 may operate in response to an output of the feedback circuit 330 that controls an output feedback operation. For example, when the seventh transistor TR22 is turned off, a second source current ISS2 may not flow through the seventh transistor TR22, and power consumption of the second amplifier 300 may decrease.

However, the present disclosure is not limited thereto. The connection of the seventh transistor TR22 may be implemented to be different from that illustrated in FIG. 7. In addition, the seventh transistor TR22 is illustrated as being an NMOS transistor, but may be implemented with a combination of a PMOS transistor and a logic gate (e.g., an AND gate).

The switching circuit 310 may include the eighth transistor TR23 connected between the third output node OUT21 and a bias node BN. During the auto-zero period, the eighth transistor TR23 may operate in response to the auto-zero signal AZ, and may be turned on when the auto-zero signal AZ is activated. When the eighth transistor TR23 is turned on, a voltage level of the bias node BN and a voltage level of the third output node OUT21 may be equalized.

In contrast, in the case where the eighth transistor TR23 is turned off as the auto-zero signal AZ is deactivated during the comparison operation of the ADC circuit 150 of FIG. 4, the voltage level of the bias node BN, which is equal to the voltage level of the third output node OUT21, may be maintained by the capacitor C1, and thus, the second current source 320 may operate.

The eighth transistor TR23 of FIG. 7 is illustrated as connected between the third output node OUT21 and the bias node BN, but the present disclosure is not limited thereto. For example, the eighth transistor TR23 may be connected between the fourth output node OUT22 and the bias node BN. In this case, when the eighth transistor TR23 is turned on in response to the activated auto-zero signal AZ, a voltage level of the bias node BN and a voltage level of the fourth output node OUT22 may be equalized.

The second current source 320 may include the ninth transistor TR24 connected with the fourth output node OUT22. The ninth transistor TR24 may generate the source current ISS2 based on a voltage of the bias node BN, that is, a voltage of one end of the capacitor C1.

The feedback circuit 330 may control the second current source 320 based on the second output signal OTA2_OUT and a feedback enable signal FB_EN. To perform the output feedback operation, the feedback circuit 330 may include a logic gate 331. For example, the logic gate 331 may be a NAND gate.

The logic gate 331 may output a feedback signal FB in response to the second output signal OTA2_OUT and the feedback enable signal FB_EN. For example, the logic gate 331 may be implemented such that a voltage level of the feedback signal FB is set to the low level when both a voltage level of the feedback enable signal FB_EN and a voltage level of the second output signal OTA2_OUT are the high level.

When the voltage level of the feedback signal FB is the high level, the seventh transistor TR22 may be turned on, and the second source current ISS2 may flow through the seventh transistor TR22. However, when the voltage level of the feedback signal FB is the low level, the seventh transistor TR22 may be turned off, and the second source current ISS2 fails to flow through the seventh transistor TR22.

In detail, after the comparison operation of the ramp signal RAMP and the pixel signal PIX is terminated, the voltage level of the first output signal OTA1_OUT may be the low level, and the voltage level of the second output signal OTA2_OUT may be the high level. In this case, before the feedback enable signal FB_EN is activated, the feedback signal FB may be at the high level, the seventh transistor TR22 may be in a turn-on state, and the second source current ISS2 may flow through the seventh transistor TR22.

In contrast, when the feedback enable signal FB_EN is activated (i.e., when the voltage level of the feedback enable signal FB_EN is the high level), the voltage level of the feedback signal FB may transition to the low level. In this case, because the seventh transistor TR22 is turned off, the second source current ISS2 may not flow through the seventh transistor TR22. As such, by utilizing an output feedback after the comparison operation ends, power consumption of the second amplifier 300 may decrease. This may mean that power consumption of the ADC circuit 150 also decreases.

As a difference in the power consumption before and after performing the comparison operation is maintained, the performance of an image sensor (e.g., the performance of an ADC circuit converting a pixel signal into a digital signal) may be degraded. According to the above operation of the feedback circuit 330, the second source current ISS2 may not flow through the output nodes OUT21 and OUT22 after the comparison operation is performed, and thus, the difference in the power consumption before and after performing the comparison operation may decrease. Accordingly, the degradation of performance of the image sensor may be prevented or reduced by the operation of the feedback circuit 330.

Meanwhile, the logic gate 331 of FIG. 7 is illustrated as being a NAND gate, but the present disclosure is not limited thereto. For example, the feedback circuit 330 may be implemented as any other component(s) (e.g., a NOR gate and an inversion amplifier) such that the feedback signal FB is set to the low level when the voltage level of the second output signal OTA2_OUT is the high level.

Also, the feedback circuit 330 of FIG. 7 is illustrated as directly receiving the second output signal OTA2_OUT, but the present disclosure is not limited thereto. For example, the feedback circuit 330 of FIG. 7 may be configured to receive any other signal that is based on the second output signal OTA2_OUT. For example, the second amplifier 300 may further include a transistor, a switch, an inverter, or a logic gate connected between the sixth transistor TR21 and the third output node OUT21. In this case, the logic gate 331 of the feedback circuit 330 may receive a signal that is obtained after the second output signal OTA2_OUT passes through the transistor, the switch, the inverter, or the logic gate, and may perform the comparison operation described above.

In other words, the feedback circuit 330 may directly receive the second output signal OTA2_OUT, or may receive a signal that is obtained after the second output signal OTA2_OUT passes through the transistor, the switch, the inverter, or the logic gate between the sixth transistor TR21 and the third output node OUT21.

The control circuit 340 may adjust an output of a control current ICN to alleviate a difference in power consumption of the second amplifier 300 before and after performing the comparison operation. The control circuit 340 may include the tenth and eleventh transistors TR25 and TR26 that are connected between a power supply voltage VDD and the third output node OUT21, and is connected in parallel with the sixth transistor TR21. The tenth transistor TR25 may operate in response to a control signal CN, and the eleventh transistor TR26 may operate in response to a bias signal BIAS.

When the control signal CN is deactivated, the tenth transistor TR25 may be turned off, and the control current ICN may not flow through the eleventh transistor TR26. Meanwhile, when the tenth transistor TR25 is turned on by the control signal CN activated and the eleventh transistor TR26 is turned on by the bias signal BIAS, the control current ICN may flow to the output nodes OUT21 and OUT22 through the tenth transistor TR25 and the eleventh transistor TR26.

After decision about a large-small relationship between a level of the ramp signal RAMP and a level of the pixel signal PIX is completed, a level of the second source current ISS2 may increase, and a power may be continuously consumed even after the comparison operation is performed. As described above, as a difference in power consumption before and after performing the comparison operation is maintained, the performance of an image sensor may be degraded.

The control circuit 340 may operate to prevent the degradation of performance of the image sensor. After the ramp signal RAMP begins to ramp down, as the control signal CN and the bias signal BIAS are activated, as described above, the control current ICN may flow to the output nodes OUT21 and OUT22 through the tenth and eleventh transistors TR25 and TR26, and a level of the second source current ISS2 may increase as much as a level of the control current ICN.

For example, a level (hereinafter referred to as a "second level") of the second source current ISS2 increased as much as a level of the control current ICN after the ramp signal RAMP begins to ramp down may be higher than a level (hereinafter referred to as a "first level") of the second source current ISS2 before the comparison operation is performed, and may be lower than a level (hereinafter referred to as a "third level") of the second source current ISS2 after the comparison operation is performed (i.e., after the decision about the large-small relationship between a voltage level of the ramp signal RAMP and a voltage level of the pixel signal PIX is completed).

According the above operation of the control circuit 340, both a difference between the first level and the second level and a difference between the second level and the third level may be smaller than a difference between the first level and the third level. As such, a difference in power consumption at the second amplifier 300 before and after the comparison operation may be alleviated, and the degradation of performance of the image sensor may be prevented or reduced.

Accordingly, the degradation of performance of the image sensor due to the power consumption difference before and after the comparison operation may be prevented or reduced by the operation of the feedback circuit 330 or the operation of the control circuit 340, which is described above. For example, in the case where the second current source 320 is controlled by using the output feedback of the feedback circuit 330, the operation of the control circuit 340 may not be required. In this case, the second amplifier 300 may not include the control circuit 340. An example of the second amplifier 300 that does not include the control circuit 340 will be described with reference to FIG. 9.

Figure 8A:
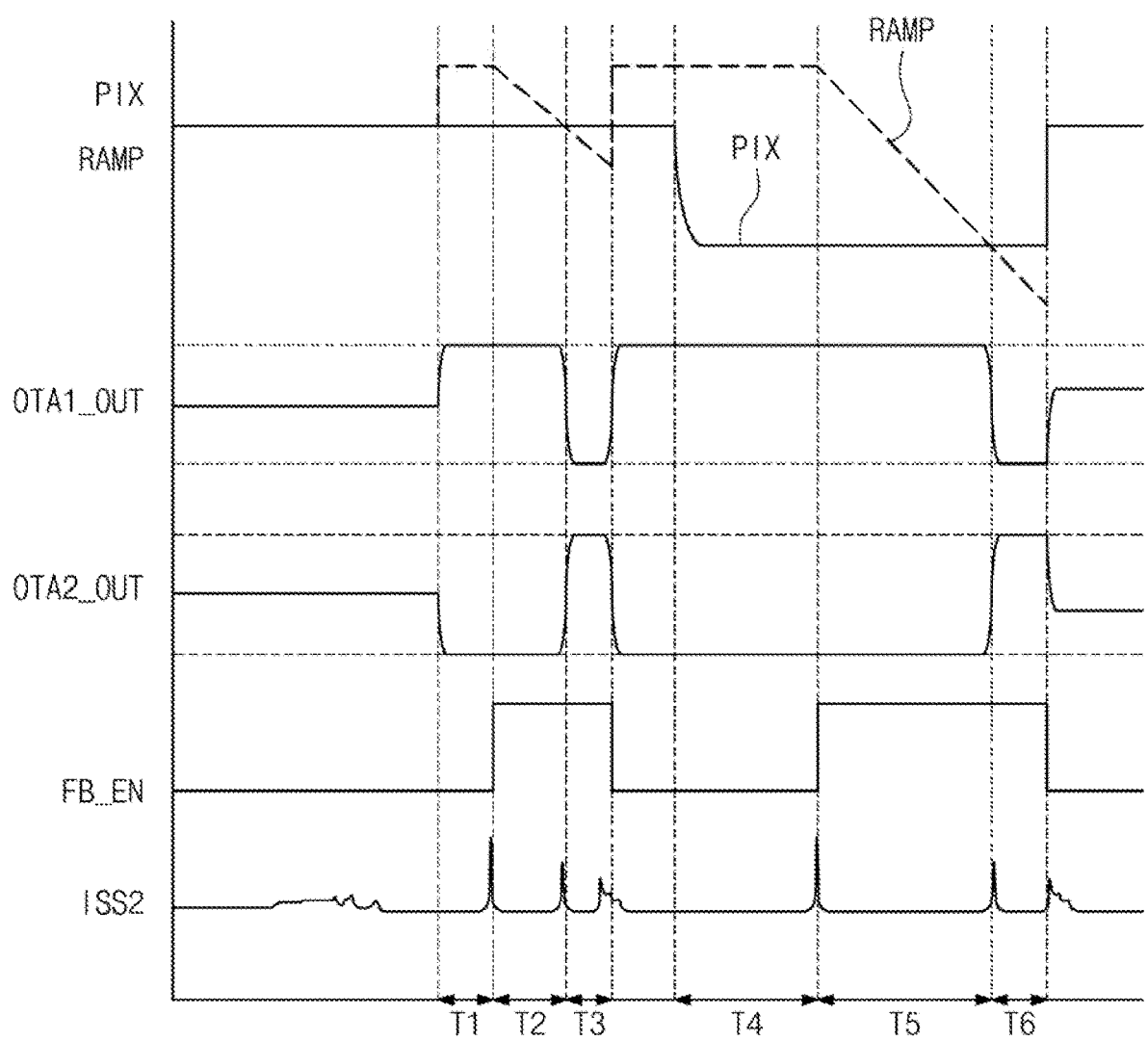
FIG. 8A is an example of a timing diagram illustrating an operation of an analog-to-digital converting circuit of FIG. 4 according to an operation of a feedback circuit of FIG. 7.
Figure 8B:
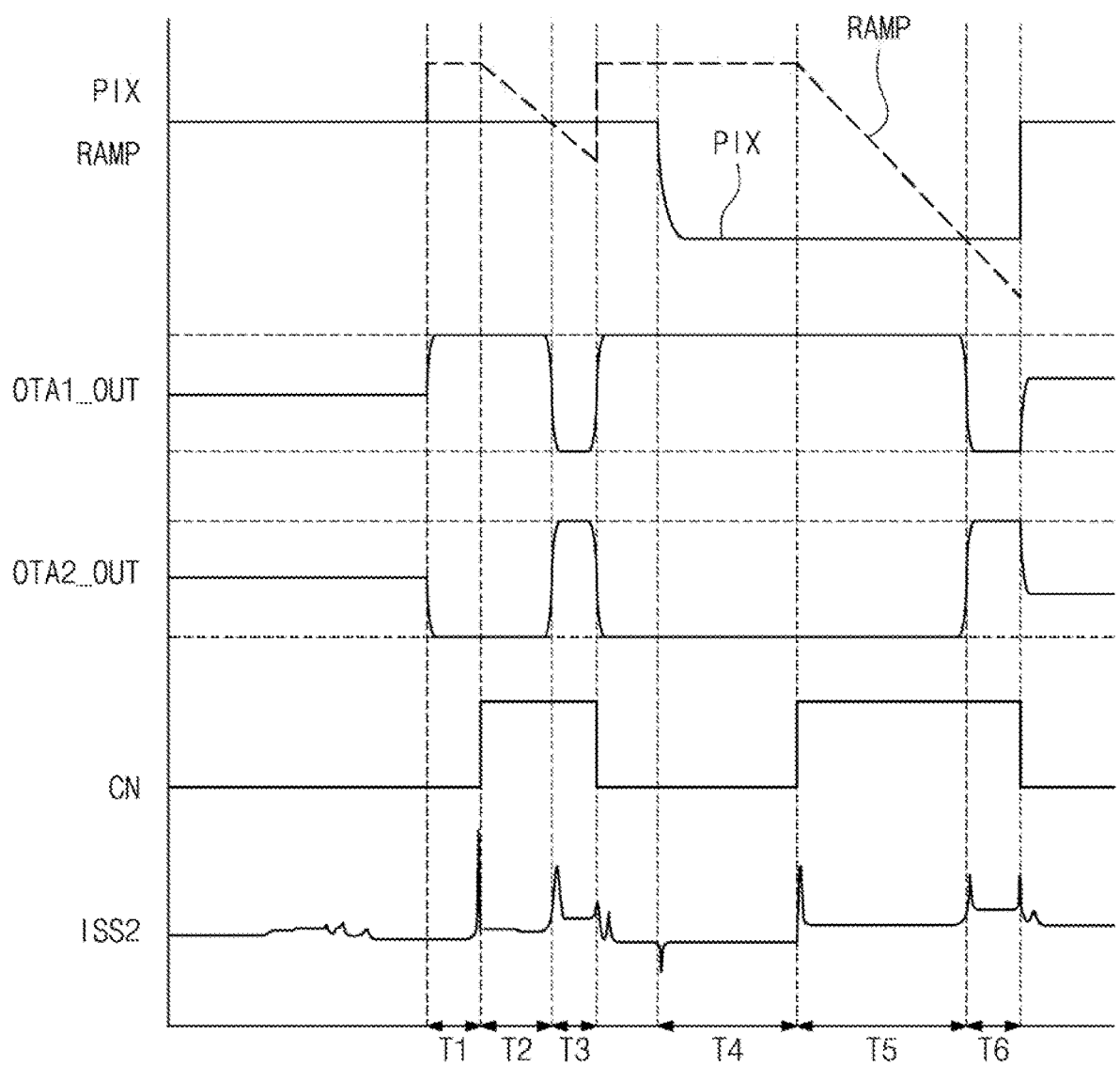
FIG. 8B is an example of a timing diagram illustrating an operation of an analog-to-digital converting circuit of FIG. 4 according to an operation of a control circuit of FIG. 7.

FIG. 8A is an example of a timing diagram illustrating an operation of the ADC circuit 150 of FIG. 4 according to an operation of the feedback circuit 330 of FIG. 7, and FIG. 8B is an example of a timing diagram illustrating an operation of the ADC circuit 150 of FIG. 4 according to an operation of the control circuit 340 of FIG. 7. FIGS. 8A and 8B will be described with reference to FIGS. 4 to 7, and an operation of the ADC circuit 150 which is duplicated with that given with reference to FIG. 5 will be omitted.

Referring to FIGS. 8A and 8B, an auto-zero period may precede time period T1, and time period T1 to time period T3 may correspond to a period in which the comparator 151 compares a reset signal of the pixel signal PIX and the ramp signal RAMP, and time period T4 to time period T6 may correspond to a period in which the comparator 151 compares an image signal of the pixel signal PIX and the ramp signal RAMP.

Referring to FIG. 8A, the feedback enable signal FB_EN may be activated when the decision of the ADC circuit 150 is completed (i.e., when time period T2 ends and when time period T5 ends). For example, a voltage level of the feedback enable signal FB_EN may be maintained at the high level during time period T2 and time period T3 in which the ramp signal RAMP ramps down and/or during time period T5 and time period T6 in which the ramp signal RAMP ramps down.

The feedback circuit 330 may output the feedback signal FB based on the feedback enable signal FB_EN and the second output signal OTA2_OUT. A transistor (e.g., the seventh transistor TR22 of FIG. 7) between the current source 320 and an output node may be turned off in response to the feedback signal FB of the low level, and the second source current ISS2 may not flow.

Accordingly, the operation of the feedback circuit 330 may allow the second source current ISS2 to have almost the same or substantially the same level during a time period T1, a time period T2 and a time period T3, and during a time period T4, a time period T5 and a time period T6. For example, the level of the second source current ISS2 may be close to "0" during each of the time periods T1, T2 and T3, and each of the time periods T4, T5 and T6. As such, power consumption of the ADC circuit 150 may decrease.

Referring to FIG. 8B, the control signal CN may be activated during time period T2 and time period T3 in which the ramp signal RAMP ramps down and during time period T5 and time period T6 in which the ramp signal RAMP ramps down. The control circuit 340 may output the control current ICN to the output nodes OUT21 and OUT22 in response to the control signal CN activated. As such, a level of the second source current ISS2 in time period T2 and time period T5 may increase as much as a level of the control current ICN, that is, may be higher than a level of the second source current ISS2 in time period T1 and time period T4. Accordingly, through the operation of the control circuit 340, a level difference of the second source current ISS2 between time period T1 and time period T3 and between time period T4 and time period T6, that is, a difference in power consumption may be alleviated.

In the above embodiments, the comparison operation performed by the comparator 151 is based on the ramp signal RAMP which is a ramping-up signal generated by the ramp generator 130. However, the comparison operation may also be performed based on a ramp signal which is a ramping-down signal, according to an embodiment.

Figure 9:
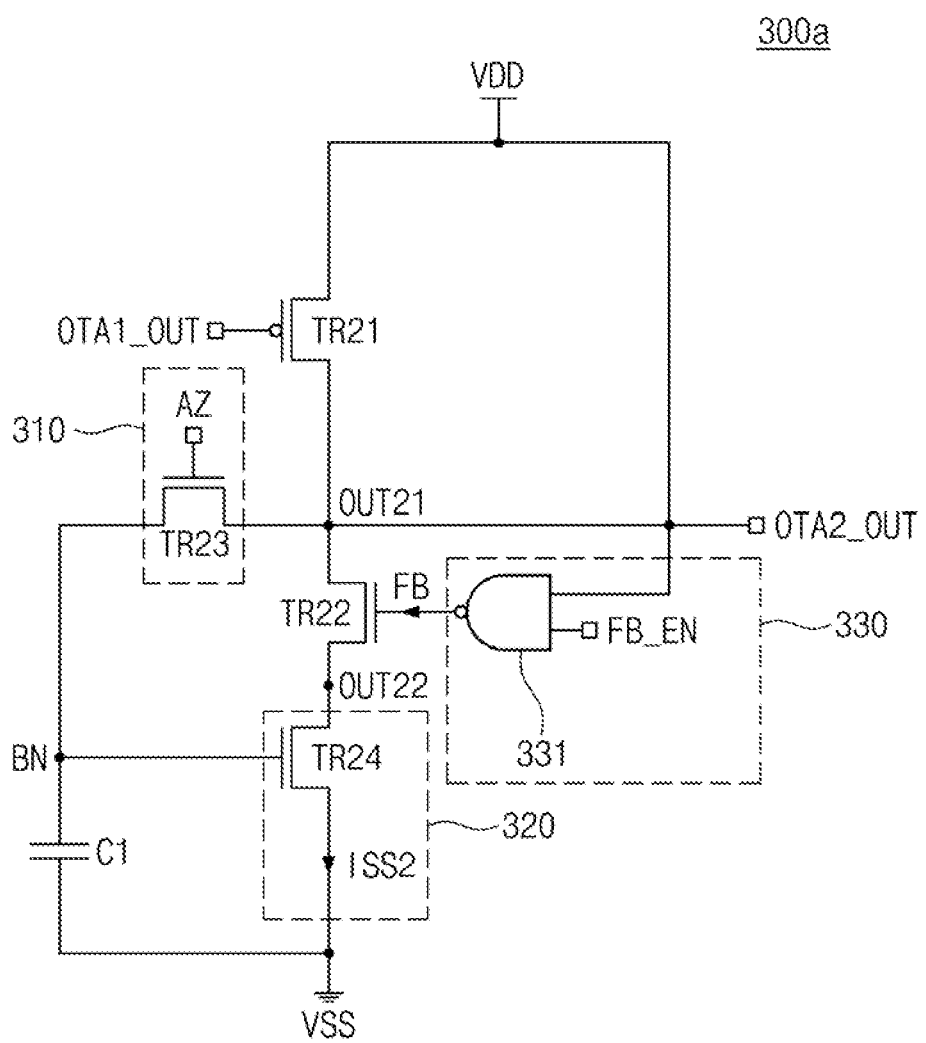
FIG. 9 is a circuit diagram illustrating another example of a second amplifier of FIG. 4.

FIG. 9 is a circuit diagram illustrating another example of the second amplifier 151_2 of FIG. 4. As described with reference to FIG. 7, in the case where the second current source 320 is controlled by using an output feedback of the feedback circuit 330, the second amplifier 300 may not include the control circuit 340. A configuration and an operation of a second amplifier 300a illustrated in FIG. 9 are identical to those of the second amplifier 300 of FIG. 7 except that the second amplifier 300a does not include the control circuit 340 of FIG. 7, and thus, additional description will be omitted to avoid redundancy.

Figure 10:
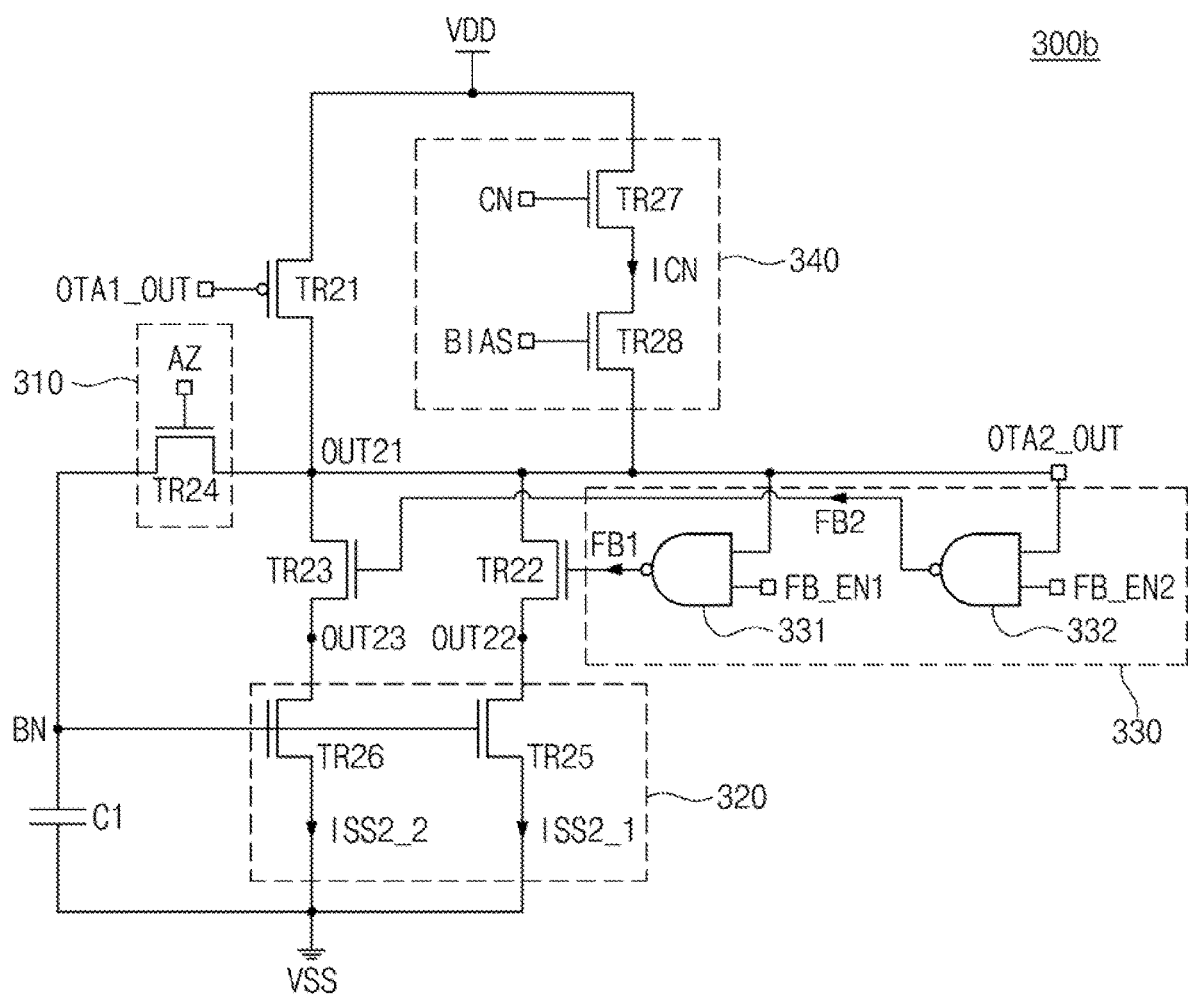
FIG. 10 is a circuit diagram illustrating another example of a second amplifier of FIG. 4.

FIG. 10 is a circuit diagram illustrating another example of the second amplifier 151_2 of FIG. 4. A second amplifier 300b may include the feedback circuit 330, and the feedback circuit 330 may include a plurality of logic gates 331 and 332. Also, the second amplifier 300b may further include transistors TR22 and TR23 respectively corresponding to the logic gates 331 and 332. In addition, the second current source 320 of the second amplifier 300b may be implemented to output a first sub-source current ISS2_1 and a second sub-source current ISS2_2.

An example in which the second current source 320 outputs two sub-source currents ISS2_1 and ISS2_2 is illustrated in FIG. 10, but the present disclosure is not limited thereto. The second current source 320 may be implemented to output more sub-source currents. Likewise, an example in which the feedback circuit 330 includes two logic gates 331 and 332 is illustrated in FIG. 10, but the present disclosure is not limited thereto. For example, the feedback circuit 330 may include a more number of logic gates, and the second amplifier 300b may include a more number of transistors respectively corresponding to the logic gates. Below, the description duplicated with the configuration and function of the second amplifier 300 of FIG. 7 will be omitted.

The first logic gate 331 may output a first feedback signal FB1 in response to the second output signal OTA2_OUT and a first feedback enable signal FB_EN1, and the second logic gate 332 may output a second feedback signal FB2 in response to the second output signal OTA2_OUT and a second feedback enable signal FB_EN2.

Even though the second output signal OTA2_OUT are identically input to the feedback circuit 330, the seventh transistor TR22 or the eighth transistor TR23 may be selectively turned on or turned off depending on the first feedback enable signal FB_EN1 or the second feedback enable signal FB_EN2. As the seventh transistor TR22 or the eighth transistor TR23 is selectively turned on or turned off, the sub-source currents ISS2_1 and ISS2_2 may also selectively flow.

By selectively controlling the sub-source currents ISS2_1 and ISS2_2, a level of a current that the second amplifier 300b consumes may be gradually controlled, and power consumption of the second amplifier 300b may also gradually decrease. An example in which the logic gates 331 and 332 are NAND gates is illustrated in FIG. 10, but the present disclosure is not limited thereto. For example, the feedback circuit 330 may be implemented as having any other configuration.

Referring again to FIGS. 4, 7, and 10, the second amplifier 151_2 of the ADC circuit 150 may block the second source current ISS2 as described with reference to FIG. 7 or may gradually decrease a current, which the second amplifier 151_2 consumes, through a selective control of the sub-source currents ISS2_1 and ISS2_2 as described with reference to FIG. 10, and thus, power consumption of the ADC circuit 150 may decrease.

Figure 11:
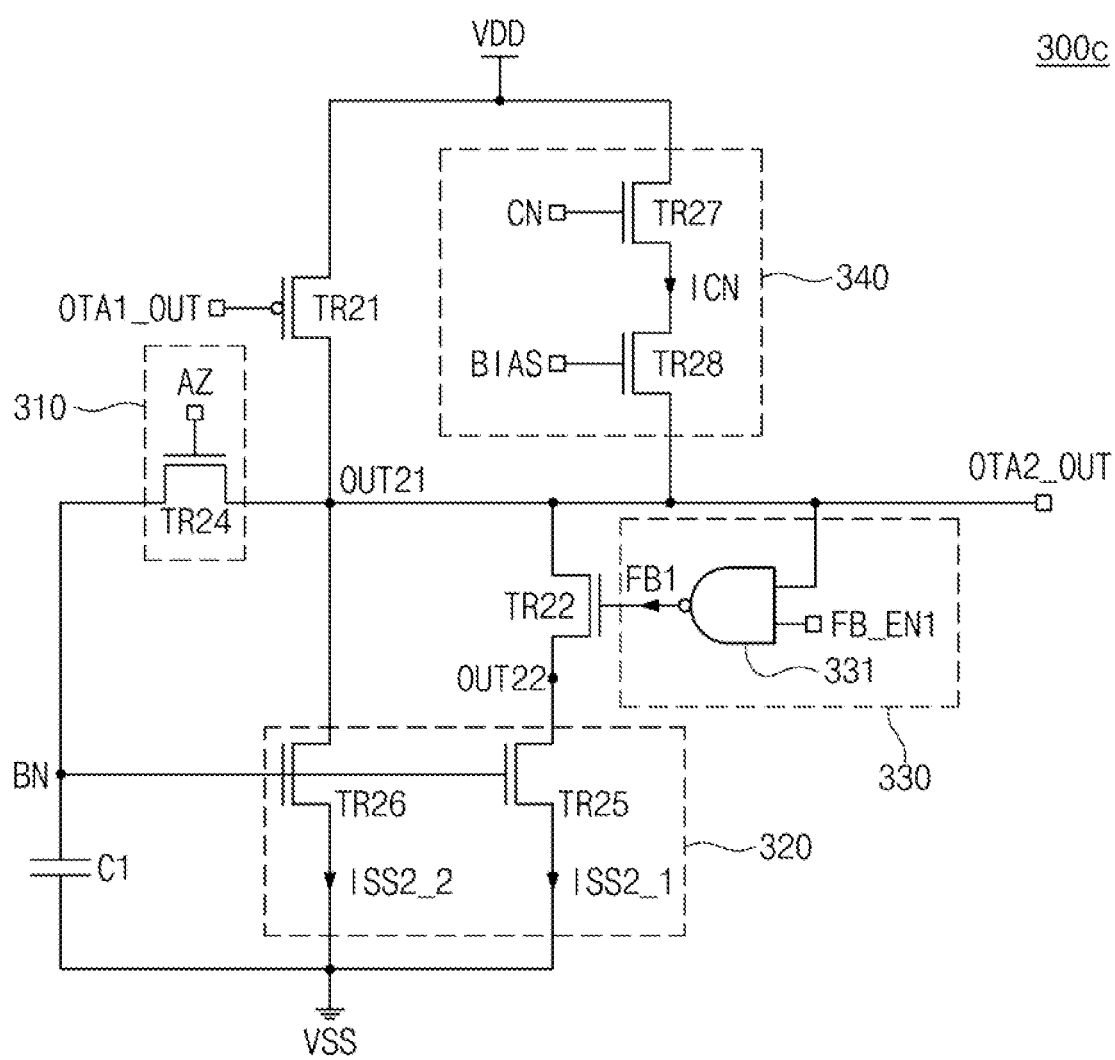
FIG. 11 is a circuit diagram illustrating another example of a second amplifier of FIG. 4.

FIG. 11 is a circuit diagram illustrating another example of the second amplifier 151_2 of FIG. 4. Like the second current source 320 of FIG. 10, the second current source 320 of a second amplifier 300c may be implemented to output the first sub-source current ISS2_1 and the second sub-source current ISS2_2. However, the feedback circuit 330 of the second amplifier 300c may include one logic gate 331, and the second amplifier 300c may include the seventh transistor TR22 corresponding to the logic gate 331. Below, the description duplicated with the configuration and function of the second amplifier 300 of FIG. 7 will be omitted.

The first sub-source current ISS2_1 may selectively flow depending on whether the seventh transistor TR22 operating in response to the first feedback signal FB1 is turned on or turned off, but the second sub-source current ISS2_2 may not be controlled by the feedback circuit 330. In other words, even though the second amplifier 151_2 of the ADC circuit 150 is implemented such that a plurality of sub-source currents may flow, only some sub-source currents may be selectively controlled, and the remaining sub-source currents may not be controlled.

Figure 12:
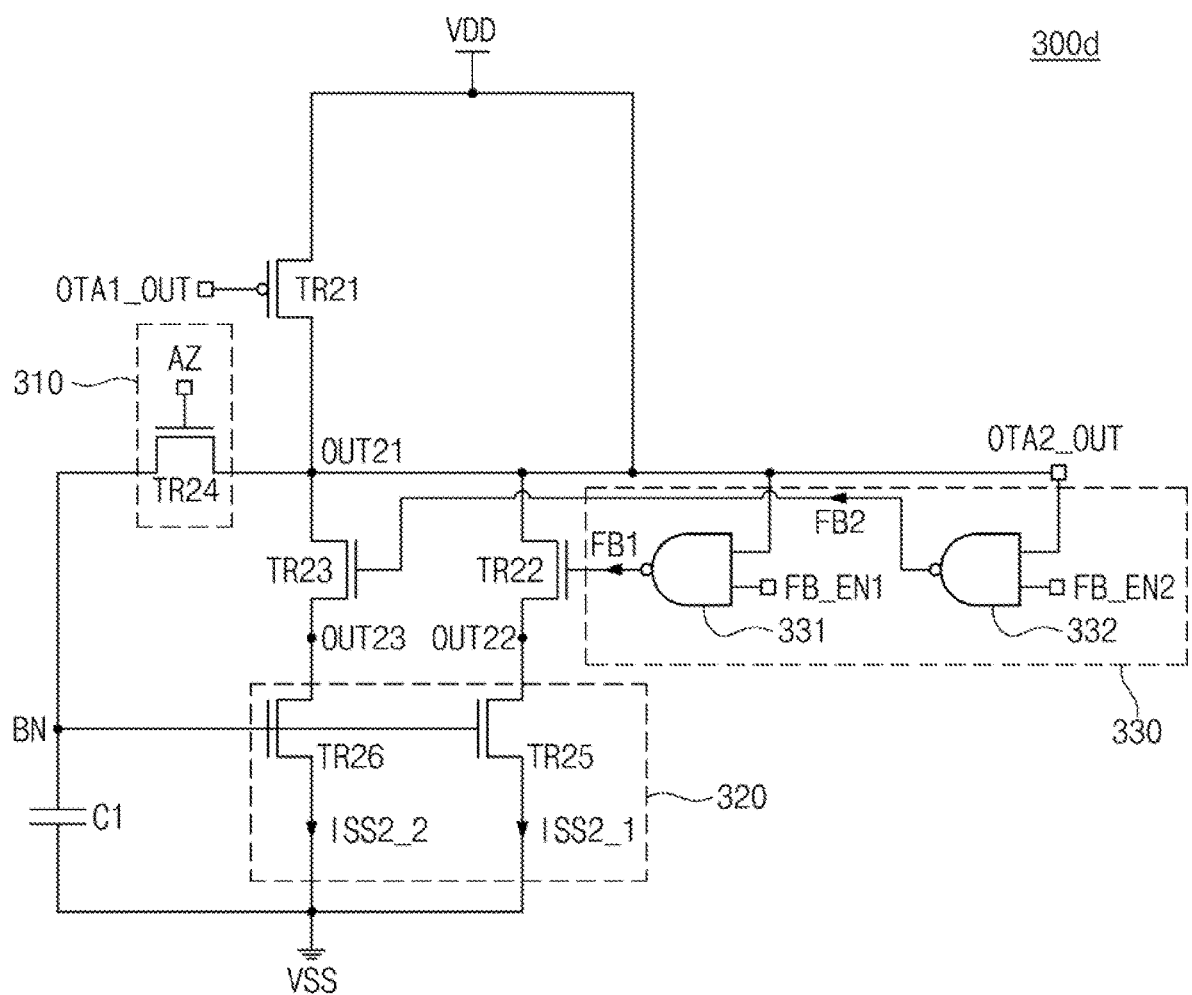
FIG. 12 is a circuit diagram illustrating another example of a second amplifier of FIG. 4.

FIG. 12 is a circuit diagram illustrating another example of the second amplifier 151_2 of FIG. 4. As described with reference to FIGS. 7 and 9, in the case where the second current source 320 is controlled by using an output feedback of the feedback circuit 330, the second amplifier 300 may not include the control circuit 340. A configuration and an operation of a second amplifier 300d illustrated in FIG. 12 are identical to those of the second amplifier 300b of FIG. 10 except that the second amplifier 300d does not include the control circuit 340, and thus, additional description will be omitted to avoid redundancy.

Figure 13:
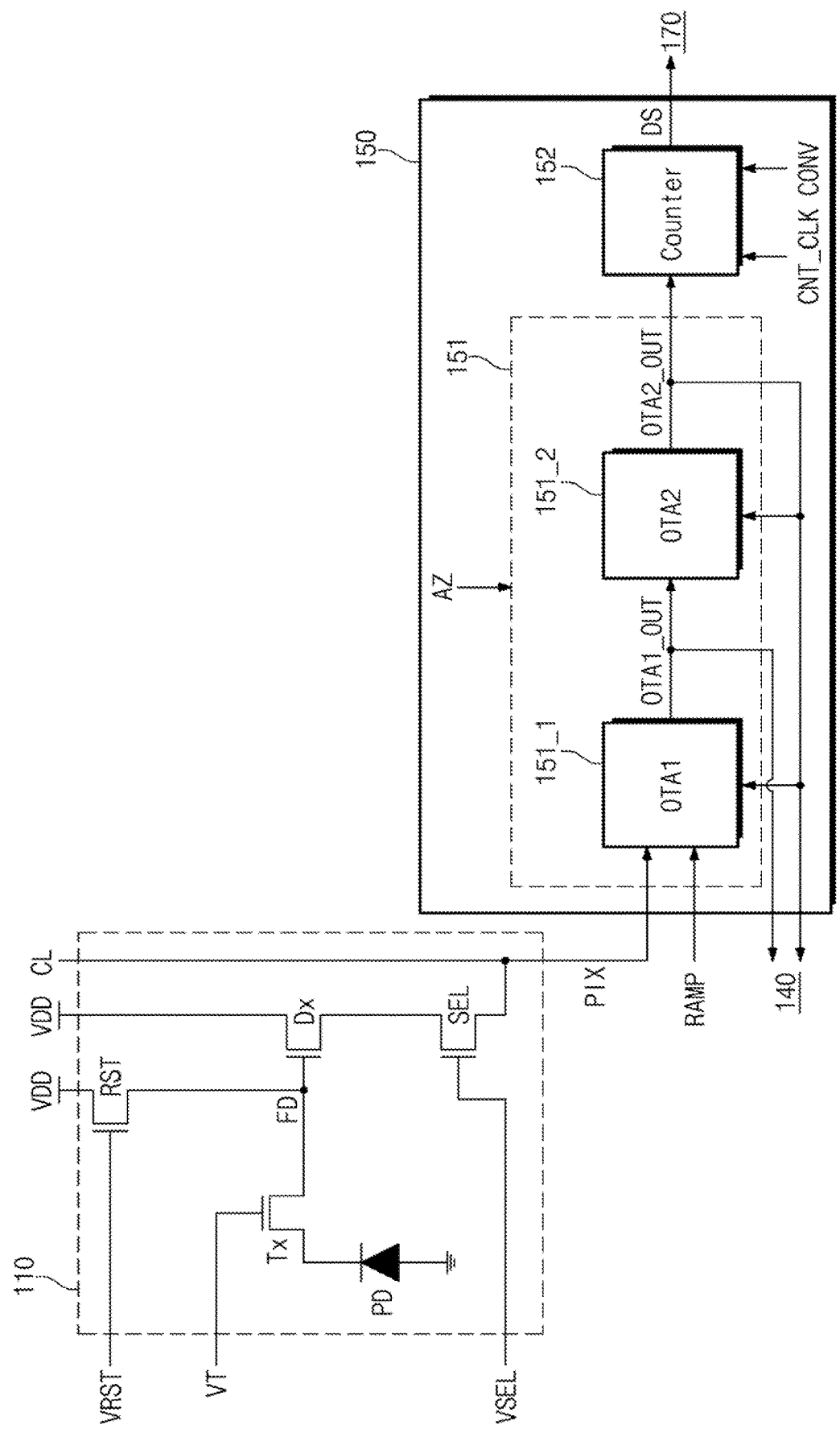
FIG. 13 illustrates another example of a configuration of an analog-to-digital converting circuit of FIG. 2.

FIG. 13 illustrates another example of a configuration of the analog-to-digital converting (ADC) circuit 150 of FIG. 2. As described with reference to FIG. 4, the second output signal OTA2_OUT may be fed back to the second amplifier 151_2, and may control a power source (e.g., a current source) of the second amplifier 151_2. Also, referring to FIG. 13, the second output signal OTA2_OUT may be fed back to the voltage buffer 140 and/or the first amplifier 151_1, and control a power source of the first amplifier 151_1.

In addition, the first output signal OTA1_OUT may also be fed back to the voltage buffer 140 as well as the first amplifier 151_1. The first output signal OTA1_OUT fed back to the first amplifier 151_1 may control a power source of the first amplifier 151_1. Power consumption of the ADC circuit 150 may decrease through the above feedback operations of the first output signal OTA1_OUT and the second output signal OTA2_OUT.

A function of the ADC circuit 150 of FIG. 13 is identical to that described with reference to FIG. 4 except for the above output feedback operations, and thus, additional description will be omitted to avoid redundancy.

Figure 14:
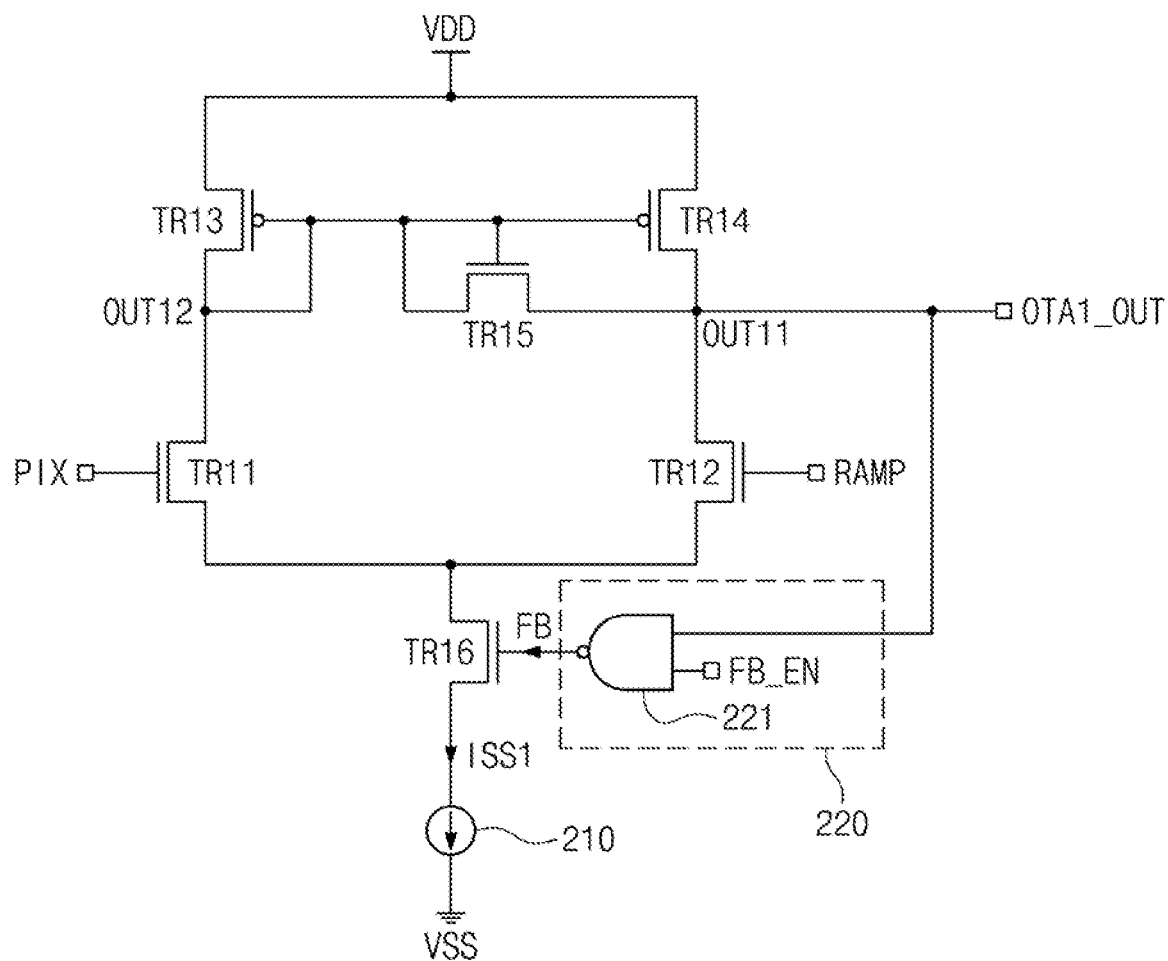
FIG. 14 is a circuit diagram illustrating an example of a first amplifier of FIG. 13.

FIG. 14 is a circuit diagram illustrating an example of the first amplifier 151_1 of FIG. 13. A first amplifier 200a of FIG. 14 may include a feedback circuit 220 that may control the first current source 210 based on the first output signal OTA1_OUT and the feedback enable signal FB_EN. Also, the first amplifier 200a may further include a sixth transistor TR16 operating in response to an output of the feedback circuit 220. For example, the sixth transistor TR16 may be an NMOS transistor, but the present disclosure is not limited thereto.

The feedback circuit 220 may control the first current source 210 based on the first output signal OTA1_OUT and the feedback enable signal FB_EN. To perform the output feedback operation, the feedback circuit 220 may include a logic gate 221. For example, the logic gate 221 may be a NAND gate, but the present disclosure is not limited thereto.

When the sixth transistor TR16 is turned off in response to the feedback signal FB, the first source current ISS1 fails to flow through the sixth transistor TR16. Accordingly, power consumption of the first amplifier 200a may decrease, and power consumption of the ADC circuit 150 may decrease as well.

In addition, the first output signal OTA1_OUT may be fed back to the voltage buffer 140 of FIG. 2. As described with reference to FIG. 13, the second output signal OTA2_OUT that is output from the second amplifier 151_2 may also be fed back to the first current source 210 through the feedback circuit 220.

A function and an operation of the first amplifier 200a of FIG. 14 are identical to the function and the operation of the first amplifier 200 of FIG. 6 except for the above output feedback operation, and thus, additional description will be omitted to avoid redundancy.

Figure 15:
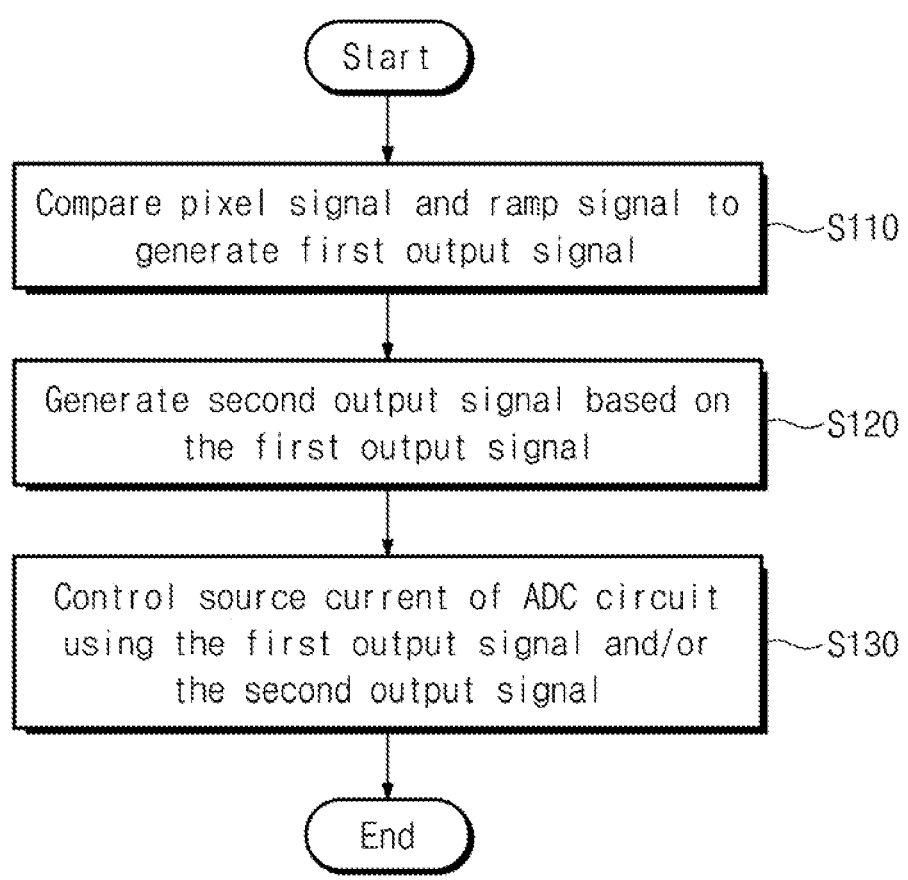
FIG. 15 is a flowchart illustrating an operation method of an analog-to-digital converting circuit using an output feedback, according to an embodiment.

FIG. 15 is a flowchart illustrating an operation method of an analog-to-digital converting circuit using an output feedback, according to an embodiment. FIG. 15 will be described with reference to FIGS. 2, 4, and 7.

In operation S110, the first amplifier 151_1 may compare the pixel signal PIX from the pixel array 110 and the ramp signal RAMP to generate the first output signal OTA1_OUT. In detail, in operation S110, the first amplifier 151_1 may compare a reset signal of the pixel signal PIX and the ramp signal RAMP, compare an image signal of the pixel signal PIX and the ramp signal RAMP, and perform correlated double sampling (CDS) on comparison results.

For example, in operation S110, in a period where a level of the ramp signal RAMP is higher than a level of the pixel signal PIX, the first amplifier 151_1 may output the first output signal OTA1_OUT having the high level, and in a period where the level of the ramp signal RAMP is lower than the level of the pixel signal PIX, the first amplifier 151_1 may output the first output signal OTA1_OUT having the low level.

In operation S120, the second amplifier 151_2 may generate the second output signal OTA2_OUT based on the first output signal OTA1_OUT. For example, the second output signal OTA2_OUT may be an inverted version of the first output signal OTA1_OUT.

In operation S130, the ADC circuit 150 may control a source current by using the first output signal OTA1_OUT and/or the second output signal OTA2_OUT. In detail, in operation S130, the feedback circuit 330 may control the second current source 320 based on the second output signal OTA2_OUT and the feedback enable signal FB_EN.

Figure 16:
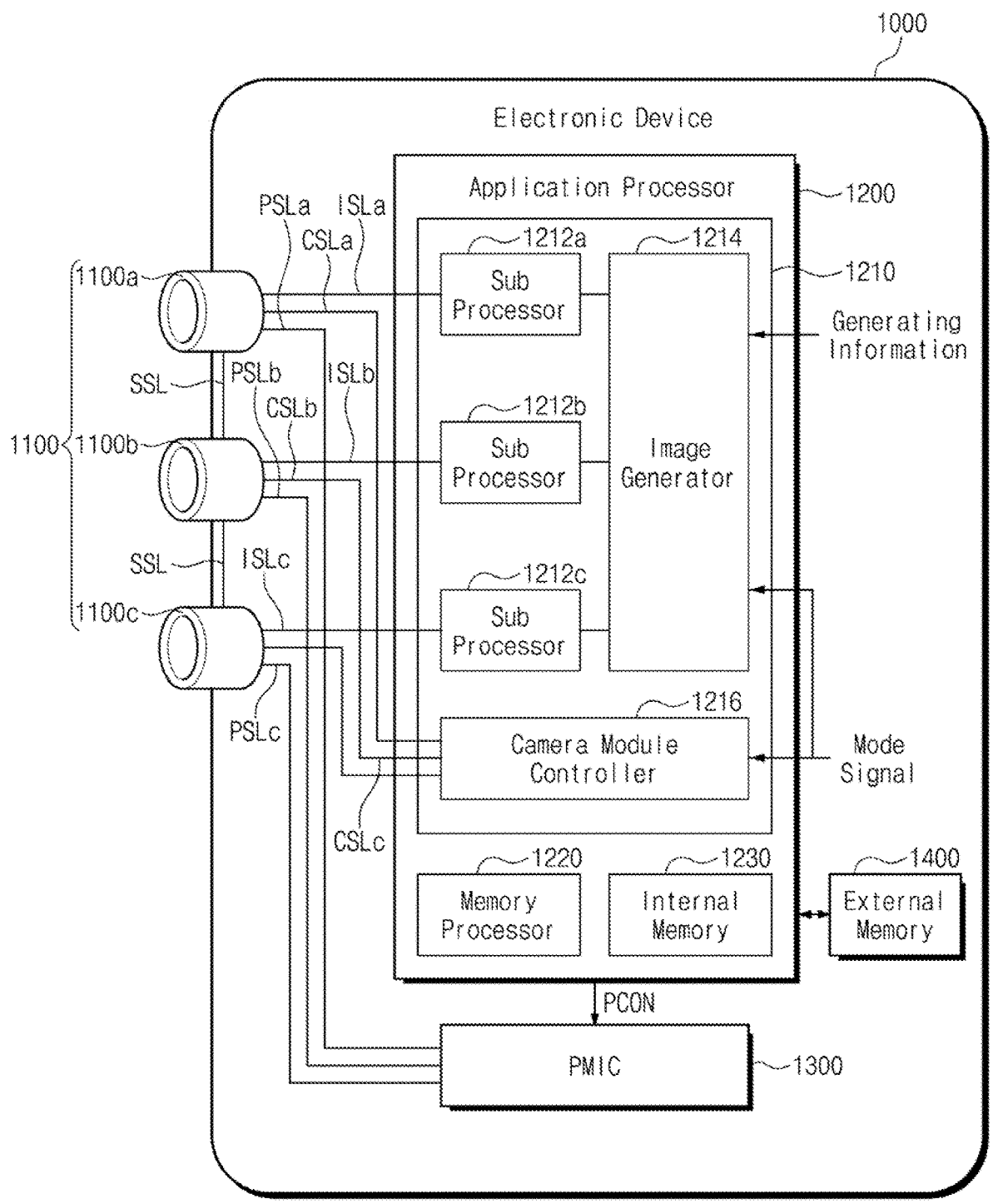
FIG. 16 illustrates an example of a configuration of an electronic device including an analog-to-digital converting circuit using an output feedback, according to an embodiment.
Figure 17:
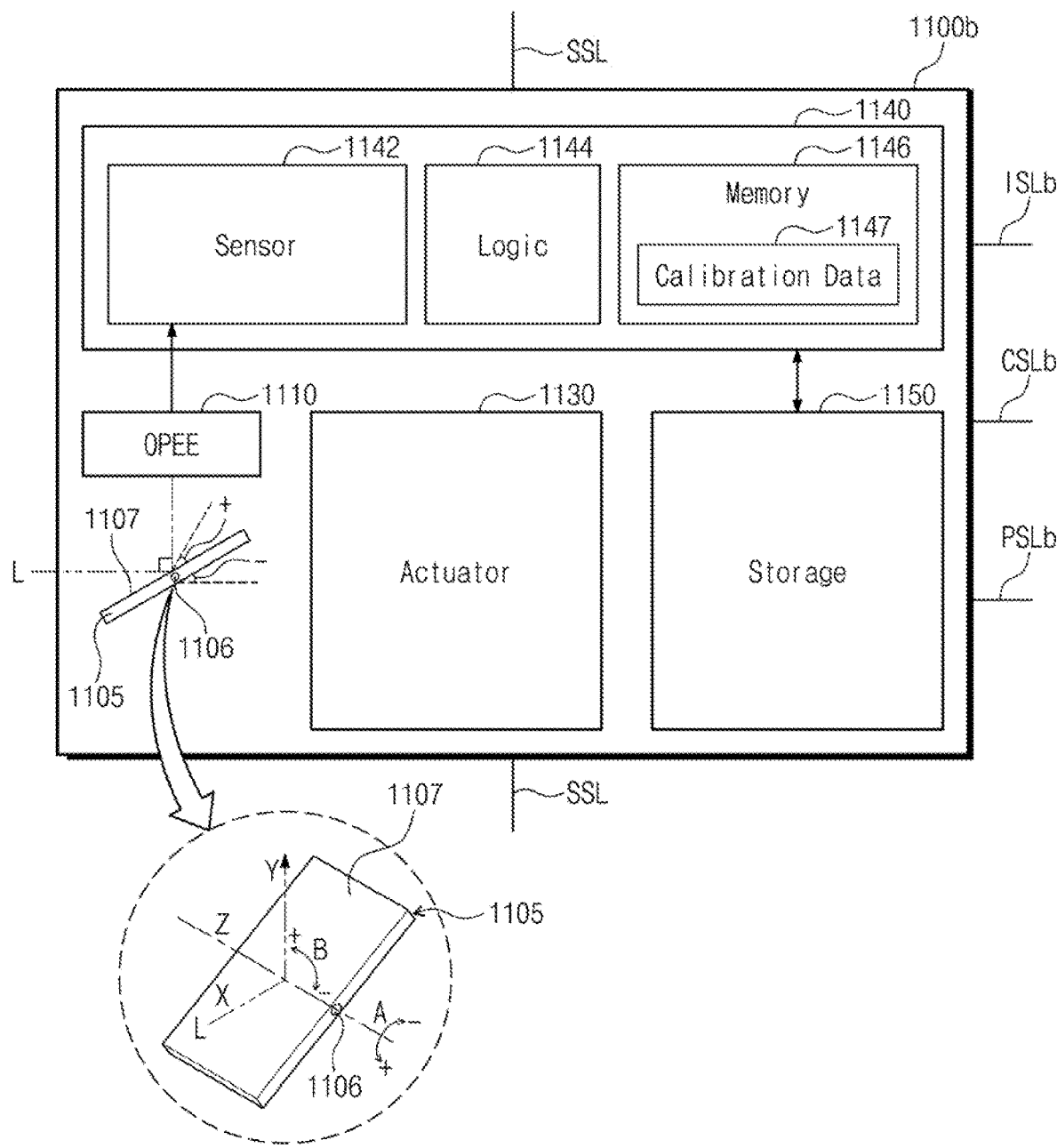
FIG. 17 illustrates an example of a configuration of a camera module of FIG. 16.

FIG. 16 illustrates an example of a configuration of an electronic device including an analog-to-digital converting (ADC) circuit using an output feedback, according to an embodiment. FIG. 17 illustrates an example of a configuration of a camera module of FIG. 16.

Referring to FIG. 16, an electronic device 1000 may include a camera module group 1100, an application processor 1200, a power management integrated circuit (PMIC) 1300, and an external memory 1400.

The camera module group 1100 may include a plurality of camera modules 1100a, 1100b, and 1100c. An embodiment in which three camera modules 1100a, 1100b, and 1100c are disposed is illustrated in FIG. 16, but embodiments are not limited thereto. In some embodiments, the camera module group 1100 may be modified to include only two camera modules. Also, in some embodiments, the camera module group 1100 may be modified to include "n" camera modules (n being a natural number of 4 or more).

Below, a detailed configuration of the camera module 1100b will be more fully described with reference to FIG. 17, but the following description may be equally applied to the remaining camera modules 1100a and 1100c.

Referring to FIG. 17, the camera module 1100b may include a prism 1105, an optical path folding element (OPFE) 1110, an actuator 1130, an image sensing device 1140, and storage 1150.

The prism 1105 may include a reflecting plane 1107 of a light reflecting material and may change a path of a light "L" incident from the outside.

In some embodiments, the prism 1105 may change a path of the light "L" incident in a first direction "X" to a second direction "Y" perpendicular to the first direction "X", Also, the prism 1105 may change the path of the light "L" incident in the first direction "X" to the second direction "Y" perpendicular to the first direction "X" by rotating the reflecting plane 1107 of the light reflecting material in direction "A" about a central axis 1106 or rotating the central axis 1106 in direction "B". In this case, the OPFE 1110 may move in a third direction "Z" perpendicular to the first direction "X" and the second direction "Y".

In some embodiments, as illustrated, a maximum rotation angle of the prism 1105 in direction "A" may be equal to or smaller than 15 degrees in a positive A direction and may be greater than 15 degrees in a negative A direction, but embodiments are not limited thereto.

In some embodiments, the prism 1105 may move within approximately 20 degrees in a positive or negative B direction, between 10 degrees and 20 degrees, or between 15 degrees and 20 degrees; here, the prism 1105 may move at the same angle in the positive or negative B direction or may move at a similar angle within approximately 1 degree.

In some embodiments, the prism 1105 may move the reflecting plane 1107 of the light reflecting material in the third direction (e.g., a Z direction) parallel to a direction in which the central axis 1106 extends.

The OPFE 1110 may include optical lenses composed of "m" groups (m being a natural number), for example. Here, "m" lens may move in the second direction "Y" to change an optical zoom ratio of the camera module 1100b. For example, when a default optical zoom ratio of the camera module 1100b is "Z", the optical zoom ratio of the camera module 1100b may be changed to an optical zoom ratio of 3Z, 5Z, or 5Z or more by moving "m" optical lens included in the OPFE 1110. The OPFE 1110 may further include "n" groups of optical lenses (n being a natural number) in front of the "m" lenses described above.

The actuator 1130 may move the OPFE 1110 or an optical lens (hereinafter referred to as an "optical lens") to a specific location. For example, the actuator 1130 may adjust a location of an optical lens such that an image sensor 1142 is placed at a focal length of the optical lens for accurate sensing.

The image sensing device 1140 may include the image sensor 1142, control logic 1144, and a memory 1146. The image sensor 1142 may sense an image of a sensing target by using the light "L" provided through an optical lens. For example, an ADC circuit of the image sensor 1142 may decrease power consumption by using an output feedback and may prevent or reduce the degradation of performance of the image sensor 1142. The control logic 1144 may control overall operations of the camera module 1100b. For example, the control logic 1144 may control an operation of the camera module 1100b based on a control signal provided through a control signal line CSLb.

The memory 1146 may store information, which is necessary for an operation of the camera module 1100b, such as calibration data 1147. The calibration data 1147 may include information necessary for the camera module 1100b to generate image data by using the light "L" provided from the outside. The calibration data 1147 may include, for example, information about the degree of rotation described above, information about a focal length, information about an optical axis, etc. In the case where the camera module 1100b is implemented in the form of a multi-state camera in which a focal length varies depending on a location of an optical lens, the calibration data 1147 may include a focal length value for each location (or state) of the optical lens and information about auto focusing.

The storage 1150 may store image data sensed through the image sensor 1142. The storage 1150 may be disposed outside the image sensing device 1140 and may be implemented in a shape where the storage 1150 and a sensor chip constituting the image sensing device 1140 are stacked. In some embodiments, the storage 1150 may be implemented with an electrically erasable programmable read only memory (EEPROM), but embodiments are not limited thereto.

Referring to FIGS. 16 and 17 together, in some embodiments, each of the plurality of camera modules 1100a, 1100b, and 1100c may include the actuator 1130. As such, the same calibration data 1147 or different calibration data 1147 may be included in the plurality of camera modules 1100a, 1100b, and 1100c depending on operations of the actuators 1130 therein.

In some embodiments, one camera module (e.g., 1100b) among the plurality of camera modules 1100a, 1100b, and 1100c may be a folded lens shape of camera module in which the prism 1105 and the OPFE 1110 described above are included, and the remaining camera modules (e.g., 1100a and 1100c) may be a vertical shape of camera module in which the prism 1105 and the OPFE 1110 described above are not included; however, embodiments are not limited thereto.

In some embodiments, one camera module (e.g., 1100c) among the plurality of camera modules 1100a, 1100b, and 1100c may be, for example, a vertical shape of depth camera extracting depth information by using an infrared ray (IR). In this case, the application processor 1200 may merge image data provided from the depth camera and image data provided from any other camera module (e.g., 1100a or 1100b) and may generate a three-dimensional (3D) depth image.

In some embodiments, at least two camera modules (e.g., 1100a and 1100b) among the plurality of camera modules 1100a, 1100b, and 1100c may have different fields of view. In this case, the at least two camera modules (e.g., 1100a and 1100b) among the plurality of camera modules 1100a, 1100b, and 1100c may include different optical lens, not limited to.

Also, in some embodiments, fields of view of the plurality of camera modules 1100a, 1100b, and 1100c may be different. In this case, the plurality of camera modules 1100a, 1100b, and 1100c may include different optical lens, not limited thereto.

In some embodiments, the plurality of camera modules 1100a, 1100b, and 1100c may be disposed to be physically separated from each other. That is, the plurality of camera modules 1100a, 1100b, and 1100c may not use a sensing area of one image sensor 1142, but the plurality of camera modules 1100a, 1100b, and 1100c may include independent image sensors 1142 therein, respectively.

Returning to FIG. 16, the application processor 1200 may include an image processing device 1210, a memory controller 1220, and an internal memory 1230. The application processor 1200 may be implemented to be separated from the plurality of camera modules 1100a, 1100b, and 1100c. For example, the application processor 1200 and the plurality of camera modules 1100a, 1100b, and 1100c may be implemented with separate semiconductor chips.

The image processing device 1210 may include a plurality of sub image processors 1212a, 1212b, and 1212c, an image generator 1214, and a camera module controller 1216.

The image processing device 1210 may include the plurality of sub image processors 1212a, 1212b, and 1212c, the number of which corresponds to the number of the plurality of camera modules 1100a, 1100b, and 1100c.

Image data respectively generated from the camera modules 1100a, 1100b, and 1100c may be respectively provided to the corresponding sub image processors 1212a, 1212b, and 1212c through separated image signal lines ISLa, ISLb, and ISLc. For example, the image data generated from the camera module 1100a may be provided to the sub image processor 1212a through the image signal line ISLa, the image data generated from the camera module 1100b may be provided to the sub image processor 1212b through the image signal line ISLb, and the image data generated from the camera module 1100c may be provided to the sub image processor 1212c through the image signal line ISLc. This image data transmission may be performed, for example, by using a camera serial interface (CSI) based on the MIPI (Mobile Industry Processor Interface), but embodiments are not limited thereto.

Meanwhile, in some embodiments, one sub image processor may be disposed to correspond to a plurality of camera modules. For example, the sub image processor 1212a and the sub image processor 1212c may be integrally implemented, not separated from each other as illustrated in FIG. 16; in this case, one of the pieces of image data respectively provided from the camera module 1100a and the camera module 1100c may be selected through a selection element (e.g., a multiplexer), and the selected image data may be provided to the integrated sub image processor.

The image data respectively provided to the sub image processors 1212a, 1212b, and 1212c may be provided to the image generator 1214. The image generator 1214 may generate an output image by using the image data respectively provided from the sub image processors 1212a, 1212b, and 1212c, depending on image generating information or a mode signal.

In detail, the image generator 1214 may generate the output image by merging at least a portion of the image data respectively generated from the camera modules 1100a, 1100b, and 1100c having different fields of view, depending on the image generating information or the mode signal. Also, the image generator 1214 may generate the output image by selecting one of the image data respectively generated from the camera modules 1100a, 1100b, and 1100c having different fields of view, depending on the image generating information or the mode signal.

In some embodiments, the image generating information may include a zoom signal or a zoom factor. Also, in some embodiments, the mode signal may be, for example, a signal based on a mode selected from a user.

In the case where the image generating information is the zoom signal (or zoom factor) and the camera modules 1100a, 1100b, and 1100c have different visual fields (or fields of view), the image generator 1214 may perform different operations depending on a kind of the zoom signal. For example, in the case where the zoom signal is a first signal, the image generator 1214 may merge the image data output from the camera module 1100a and the image data output from the camera module 1100c and may generate the output image by using the merged image signal and the image data output from the camera module 1100b that is not used in the merging operation. In the case where the zoom signal is a second signal different from the first signal, without the image data merging operation, the image generator 1214 may select one of the image data respectively output from the camera modules 1100a, 1100b, and 1100c and may output the selected image data as the output image. However, embodiments are not limited thereto, and a way to process image data may be modified without limitation if necessary.

In some embodiments, the image generator 1214 may generate merged image data having an increased dynamic range by receiving a plurality of image data of different exposure times from at least one of the plurality of sub image processors 1212a, 1212b, and 1212c and performing high dynamic range (HDR) processing on the plurality of image data.

The camera module controller 1216 may provide control signals to the camera modules 1100a, 1100b, and 1100c, respectively. The control signals generated from the camera module controller 1216 may be respectively provided to the corresponding camera modules 1100a, 1100b, and 1100c through control signal lines CSLa, CSLb, and CSLc separated from each other.

One of the plurality of camera modules 1100a, 1100b, and 1100c may be designated as a master camera (e.g., 1100b) depending on the image generating information including a zoom signal or the mode signal, and the remaining camera modules (e.g., 1100a and 1100c) may be designated as a slave camera. The above designation information may be included in the control signals, and the control signals including the designation information may be respectively provided to the corresponding camera modules 1100a, 1100b, and 1100c through the control signal lines CSLa, CSLb, and CSLc separated from each other.

Camera modules operating as a master and a slave may be changed depending on the zoom factor or an operating mode signal. For example, in the case where the field of view of the camera module 1100a is wider than the field of view of the camera module 1100b and the zoom factor indicates a low zoom ratio, the camera module 1100b may operate as a master, and the camera module 1100a may operate as a slave. In contrast, in the case where the zoom factor indicates a high zoom ratio, the camera module 1100*a* may operate as a master, and the camera module 1100*b* may operate as a slave.

In some embodiments, the control signal provided from the camera module controller 1216 to each of the camera modules 1100*a*, 1100*b*, and 1100*c* may include a sync enable signal. For example, in the case where the camera module 1100*b* is used as a master camera and the camera modules 1100*a* and 1100*c* are used as a slave camera, the camera module controller 1216 may transmit the sync enable signal to the camera module 1100*b*. The camera module 1100*b* that is provided with sync enable signal may generate a sync signal based on the provided sync enable signal and may provide the generated sync signal to the camera modules 1100*a* and 1100*c* through a sync signal line SSL. The camera module 1100*b* and the camera modules 1100*a* and 1100*c* may be synchronized with the sync signal to transmit image data to the application processor 1200.

In some embodiments, the control signal provided from the camera module controller 1216 to each of the camera modules 1100*a*, 1100*b*, and 1100*c* may include mode information according to the mode signal. Based on the mode information, the plurality of camera modules 1100*a*, 1100*b*, and 1100*c* may operate in a first operating mode and a second operating mode with regard to a sensing speed.

In the first operating mode, the plurality of camera modules 1100*a*, 1100*b*, and 1100*c* may generate image signals at a first speed (e.g., may generate image signals of a first frame rate), may encode the image signals at a second speed (e.g., may encode the image signal of a second frame rate higher than the first frame rate), and transmit the encoded image signals to the application processor 1200. In this case, the second speed may be 30 times or less the first speed.

The application processor 1200 may store the received image signals, that is, the encoded image signals in the internal memory 1230 provided therein or the external memory 1400 placed outside the application processor 1200. Afterwards, the application processor 1200 may read and decode the encoded image signals from the internal memory 1230 or the external memory 1400 and may display image data generated based on the decoded image signals. For example, the corresponding one among sub image processors 1212*a*, 1212*b*, and 1212*c* of the image processing device 1210 may perform decoding and may also perform image processing on the decoded image signal.

In the second operating mode, the plurality of camera modules 1100*a*, 1100*b*, and 1100*c* may generate image signals at a third speed (e.g., may generate image signals of a third frame rate lower than the first frame rate) and transmit the image signals to the application processor 1200. The image signals provided to the application processor 1200 may be signals that are not encoded. The application processor 1200 may perform image processing on the received image signals or may store the image signals in the internal memory 1230 or the external memory 1400.

The PMIC 1300 may supply powers, for example, power supply voltages to the plurality of camera modules 1100*a*, 1100*b*, and 1100*c*, respectively. For example, under control of the application processor 1200, the PMIC 1300 may supply a first power to the camera module 1100*a* through a power signal line PSLa, may supply a second power to the camera module 1100*b* through a power signal line PSLb, and may supply a third power to the camera module 1100*c* through a power signal line PSLc.

In response to a power control signal PCON from the application processor 1200, the PMIC 1300 may generate a power corresponding to each of the plurality of camera modules 1100*a*, 1100*b*, and 1100*c* and may adjust a level of the power. The power control signal PCON may include a power adjustment signal for each operating mode of the plurality of camera modules 1100*a*, 1100*b*, and 1100*c*. For example, the operating mode may include a low-power mode. In this case, the power control signal PCON may include information about a camera module operating in the low-power mode and a set power level. Levels of the powers respectively provided to the plurality of camera modules 1100*a*, 1100*b*, and 1100*c* may be identical to each other or may be different from each other. Also, a level of a power may be dynamically changed.

According to an embodiment, power consumption of an analog-to-digital converting circuit may decrease. In particular, according to an embodiment, the degradation of performance of an image sensor may be prevented or reduced by decreasing power consumption of an analog-to-digital converting circuit included in the image sensor.

At least one of the components, elements, modules or units (collectively "components" in this paragraph) represented by a block in the drawings such as FIGS. 4, 13, 16 and 17 may be embodied as various numbers of hardware, software and/or firmware structures that execute respective functions described above, according to an example embodiment. These components may include the first amplifier 151_1, the second amplifier 151_2 and the counter 152 shown in FIG. 4, not being limited thereto. According to example embodiments, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above example embodiments may be implemented in algorithms that execute on one or more processors. Furthermore, the components represented by a block or processing steps may employ any number of related art techniques for electronics configuration, signal processing and/or control, data processing and the like While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A circuit comprising:
   a first amplifier configured to generate a first output signal by comparing a ramp signal and a reset signal of a pixel signal output from a pixel array in a first operating period and comparing the ramp signal and an image signal of the pixel signal output from the pixel array in a second operating period;
   a second amplifier configured to generate a second output signal based on the first output signal; and a counter configured to count pulses of the second output signal, and output a counting result as a digital signal, wherein, during at least one operating period of the first operating period and the second operating period, the first output signal controls a first source current of the first amplifier, or the second output signal controls at least one of the first source current of the first amplifier and a second source current of the second amplifier.

2. The circuit of claim 1, wherein the second amplifier comprises:
- a first transistor configured to provide a power supply voltage to a first output node, from which the second output signal is output, in response to the first output signal;
- a feedback circuit connected with the first output node, and configured to receive the second output signal or a signal, which is based on the second output signal, and output a feedback signal for controlling the second source current;
- a second transistor configured to connect the first output node with a second output node in response to the feedback signal; and
- a current source connected with the second transistor through the second output node, and configured to generate the second source current.

3. The circuit of claim 2, further comprising:
- a control circuit configured to output a control current in response to a control signal,
- wherein the control circuit includes:
  - a third transistor configured to generate the control current based on the power supply voltage, in response to the control signal; and
  - a fourth transistor configured to provide the control current to the first output node in response to a bias signal.

4. The circuit of claim 3, wherein, during the first operating period or the second operating period, when the ramp signal begins to ramp down or up, the control circuit is configured to output the control current to the current source through the first output node and the second output node.

5. The circuit of claim 1, wherein the second amplifier comprises:
- a first transistor configured to provide a power supply voltage to a first output node, from which the second output signal is output, in response to the first output signal;
- a feedback circuit connected with the first output node, and configured to receive the second output signal or a signal, which is based on the second output signal, and output a first feedback signal and a second feedback signal for controlling the second source current;
- a second transistor configured to connect the first output node with a second output node in response to the first feedback signal;
- a third transistor configured to connect the first output node with a third output node in response to the second feedback signal; and
- a current source connected with the second transistor through the second output node, connected with the third transistor through the third output node, and configured to generate the second source current,
- wherein the second source current comprises a first sub-source current flowing through the second transistor and a second sub-source current flowing through the third transistor.

6. The circuit of claim 5, wherein the feedback circuit comprises:

- a first logic gate configured to output the first feedback signal based on the second output signal and a first feedback enable signal; and
- a second logic gate configured to output the second feedback signal based on the second output signal and a second feedback enable signal,
- wherein the second transistor is configured to be turned off in response to the first feedback signal, and
- wherein the third transistor is configured to be turned off in response to the second feedback signal.

7. The circuit of claim 1, wherein the second amplifier comprises:
- a first transistor configured to provide a power supply voltage to a first output node, from which the second output signal is output, in response to the first output signal;
- a feedback circuit connected with the first output node, and configured to receive the second output signal or a signal, which is based on the second output signal, and to output a first feedback signal for controlling the second source current;
- a second transistor configured to connect the first output node with a second output node in response to the first feedback signal; and
- a current source connected with the second transistor through the second output node, and configured to generate the second source current,
- wherein the second source current comprises a first sub-source current flowing through the second transistor and a second sub-source current flowing through the first output node.

8. The circuit of claim 7, wherein the feedback circuit comprises:
- a first logic gate configured to output the first feedback signal based on the second output signal and a first feedback enable signal, and
- wherein the second transistor is configured to be turned off in response to the first feedback signal.

9. An image sensor comprising:
- a pixel array configured to convert a light into an electrical signal to generate a pixel signal;
- a ramp signal generator configured to generate a ramp signal; and
- an analog-to-digital converting circuit configured to convert the pixel signal into a digital signal,
- wherein the analog-to-digital converting circuit includes:
  - a first amplifier configured to generate a first output signal by comparing a reset signal of the pixel signal and the ramp signal in a first operating period and comparing an image signal of the pixel signal and the ramp signal in a second operating period;
  - a second amplifier configured to generate a second output signal based on the first output signal; and
  - a counter configured to count pulses of the second output signal, and output a counting result as a digital signal,
- wherein, during at least one operating period of the first operating period and the second operating period, the first output signal controls a first source current of the first amplifier, or the second output signal controls the first source current of the first amplifier or a second source current of the second amplifier.

10. The image sensor circuit of claim 9, wherein the second amplifier comprises:

a first transistor configured to provide a power supply voltage to a first output node, from which the second output signal is output, in response to the first output signal;

a feedback circuit connected with the first output node, and configured to receive the second output signal or a signal, which is based on the second output signal, and output a feedback signal for controlling the second source current;

a second transistor configured to connect the first output node with a second output node in response to the feedback signal; and a current source connected with the second transistor through the second output node, and configured to generate the second source current.

11. The image sensor circuit of claim 10, wherein the feedback circuit comprises a logic gate configured to output the feedback signal based on the second output signal and a feedback enable signal, and wherein the second transistor is configured to be turned off in response to the feedback signal.

12. The image sensor circuit of claim 9, wherein the second amplifier comprises:

a first transistor configured to provide a power supply voltage to a first output node, from which the second output signal is output, in response to the first output signal;

a feedback circuit connected with the first output node, and configured to receive the second output signal or a signal, which is based on the second output signal, and to output a first feedback signal and a second feedback signal for controlling the second source current;

a second transistor configured to connect the first output node with a second output node in response to the first feedback signal;

a third transistor configured to connect the first output node with a third output node in response to the second feedback signal; and a current source connected with the second transistor through the second output node, connected with the third transistor through the third output node, and configured to generate the second source current, wherein the second source current is composed of a first sub-source current flowing through the second transistor and a second sub-source current flowing through the third transistor.

13. The image sensor circuit of claim 12, wherein the feedback circuit comprises:

a first logic gate configured to output the first feedback signal based on the second output signal and a first feedback enable signal; and a second logic gate configured to output the second feedback signal based on the second output signal and a second feedback enable signal, wherein the second transistor is turned off in response to the first feedback signal, and wherein the third transistor is turned off in response to the second feedback signal.

14. The image sensor circuit of claim 9, wherein the second amplifier includes:

a first transistor configured to provide a power supply voltage to a first output node, from which the second output signal is output, in response to the first output signal;

a feedback circuit connected with the first output node, and configured to receive the second output signal or a signal, which is based on the second output signal, and to output a first feedback signal for controlling the second source current;

a second transistor configured to connect the first output node with a second output node in response to the first feedback signal; and a current source connected with the second transistor through the second output node, and configured to generate the second source current, wherein the second source current comprises a first sub-source current flowing through the second transistor and a second sub-source current flowing through the first output node.

15. The image sensor circuit of claim 14, wherein the feedback circuit comprises:

a first logic gate configured to output the first feedback signal based on the second output signal and a first feedback enable signal, and wherein the second transistor is configured to be turned off in response to the first feedback signal.

16. A circuit comprising:

a first amplifier configured to generate a first output signal by comparing a ramp signal and a reset signal of a pixel signal output from a pixel array in a first operating period and comparing the ramp signal and an image signal of the pixel signal output from the pixel array in a second operating period;

a second amplifier configured to generate a second output signal based on the first output signal; and a counter configured to count pulses of the second output signal, and output a counting result as a digital signal, wherein, during the first operating period and the second operating period, the second amplifier is configured to control a source current of the second amplifier using the second output signal.

17. The circuit of claim 16, wherein the second amplifier comprises a feedback circuit configured to receive a feedback enable signal to control a switch to flow the source current to an output node through which the second output signal is output, and wherein the feedback enable signal is configured to change from a low level to a high level or the high level to the low level, when the ramp signal begins to gradually ramp down or ramp up, to turn off the switch so that the source current does not flow to the output node.

18. The circuit of claim 17, wherein the feedback enable signal is configured to maintain the changed level until the ramp signal increase or decrease after the gradual ramp-down or the gradual ramp-up.

19. The circuit of claim 18, wherein the circuit further comprises a control circuit configured to output a control current to the output node during the feedback enable signal maintains the changed level.

20. The circuit of claim 16, wherein the second amplifier is configured to output a high-level output or a low-level output based on the first amplifier outputting a low-level output or a high-level output, respectively.

* * * * *